(12) United States Patent
Honda

(10) Patent No.: US 7,939,361 B2
(45) Date of Patent: May 10, 2011

(54) SEMICONDUCTOR DEVICE AND METHOD FOR FABRICATING SEMICONDUCTOR DEVICE

(75) Inventor: Toshiyuki Honda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 93 days.

(21) Appl. No.: 12/399,437

(22) Filed: Mar. 6, 2009

(65) Prior Publication Data

US 2009/0166784 A1  Jul. 2, 2009

Related U.S. Application Data

(63) Continuation of application No. PCT/JP2006/318400, filed on Sep. 15, 2006.

(51) Int. Cl.
*H01L 21/00* (2006.01)
(52) U.S. Cl. .............. 438/64; 438/65; 438/66; 257/432; 257/433; 257/434; 257/E31.127
(58) Field of Classification Search .................... 438/64, 438/65, 66; 257/432, 433, 434, E31.127
See application file for complete search history.

(56) References Cited

U.S. PATENT DOCUMENTS

| | | | |
|---|---|---|---|
| 6,342,406 B1 * | 1/2002 | Glenn et al. ............... | 438/57 |
| 2003/0098912 A1 | 5/2003 | Hosokai et al. | |
| 2005/0110107 A1 | 5/2005 | Yamamoto et al. | |
| 2005/0161587 A1 | 7/2005 | Mihara et al. | |
| 2005/0253211 A1 | 11/2005 | Minamio et al. | |
| 2006/0220232 A1 | 10/2006 | Tanida et al. | |

FOREIGN PATENT DOCUMENTS

| | | |
|---|---|---|
| EP | 1536478 A2 | 6/2005 |
| JP | 11-354769 A | 12/1999 |
| JP | 2003-163342 A | 6/2003 |
| JP | 2003-197885 A | 7/2003 |
| JP | 2003-258222 A | 9/2003 |
| JP | 2005-158948 A | 6/2005 |
| JP | 2005-216940 A | 8/2005 |
| JP | 2005-252183 A | 9/2005 |
| JP | 2005-327893 A | 11/2005 |
| JP | 2006-25852 A | 2/2006 |

OTHER PUBLICATIONS

International Search Report of PCT/JP2006/318400; Mailing Date of Dec. 5, 2006.
"Korean Office Action", mailed by KPO and corresponding to Korean application No. 10-2009-7004725 on Sep. 14, 2010, with English translation.

* cited by examiner

*Primary Examiner* — Zandra Smith
*Assistant Examiner* — Christy L Novacek
(74) *Attorney, Agent, or Firm* — Fujitsu Patent Center

(57) ABSTRACT

Gold bumps are located over electrode pads of a solid imaging device and an adhesive is formed over the gold bumps. A transparent plate is supported by the gold bumps and is made to adhere over the solid imaging device by the adhesive. The gold bumps and an electrode and wiring pattern formed over a circuit board are connected by gold wires. At this time the gold wires are approximately parallel to the circuit board near portions where the gold wires and the gold bumps are connected. As a result, it is easy to locate the transparent plate over the portions where the gold wires and the gold bumps are connected. By locating the adhesive over the portions where the gold wires and the gold bumps are connected, the solid imaging device can be made small and light. As a result, a smaller lighter semiconductor device is fabricated.

14 Claims, 40 Drawing Sheets

SEMICONDUCTOR DEVICE AND METHOD FOR FABRICATING SEMICONDUCTOR DEVICE

This application is a continuing application, filed under 35 U.S.C. §111(a), of International Application PCT/JP2006/318400, filed on Sep. 15, 2006.

FIELD

The embodiments discussed herein are related to a semiconductor device and a method for fabricating a semiconductor device.

BACKGROUND

In recent years electronic apparatus, such as cellular phones and portable personal computers (handy PCs), equipped with a camera using a solid imaging device, such as a CCD image sensor or a CMOS image sensor, has increased.

As cellular phones, handy PCs, and the like become smaller and lighter, smaller lighter semiconductor devices including solid imaging devices are needed.

Previously some proposals were offered with respect to a semiconductor device including a solid imaging device (see, for example, Japanese Laid-open Patent Publication No. 2003-197885).

An example of a conventional semiconductor device including a solid imaging device is illustrated in FIG. 40.

A semiconductor device 200 illustrated in FIG. 40 has a structure in which a solid imaging device 201 is mounted over a circuit board 202.

With the solid imaging device 201, a microlens (not illustrated) is located over a semiconductor substrate in which a light receiving region 203 including a plurality of light receiving elements (photosensors) is formed, and a glass plate 205 is located over the microlens with an adhesive 204 with a predetermined refractive index between.

Electrode terminals 206 are located outside the light receiving region 203 of the solid imaging device 201 and a wiring pattern 207 is formed over the circuit board 202.

The electrode terminals 206 of the solid imaging device 201 and the wiring pattern 207 formed over the circuit board 202 are connected by gold wires 208. The gold wires 208 and the periphery of the solid imaging device 201 are sealed with a sealing material 209.

In the above semiconductor device 200 part of the wiring pattern 207 formed over the circuit board 202 over which the solid imaging device 201 is mounted is used as external connection terminals 210. When the semiconductor device 200 is mounted over a motherboard of an electronic apparatus, the external connection terminals 210 are connected to a wiring pattern 212 formed over a motherboard 211 of the electronic apparatus.

With the above conventional semiconductor device the following problems arise.

In the semiconductor device illustrated in FIG. 40, the glass plate 205 is bonded over the light receiving region 203 of the solid imaging device 201 with the adhesive 204. In this case, an area for bonding the glass plate 205 to the solid imaging device 201 needs to be secured over the light receiving region 203 and among the light receiving region 203 and the electrode terminals 206.

That is to say, when the semiconductor device 200 is fabricated, a space occupied exclusively by the adhesive used for bonding the glass plate 205 needs to be secured among light receiving region 203 and the electrode terminals 206.

Accordingly, the size of the solid imaging device 201 used needs to meet the condition that such a space can be secured inside the electrode terminals 206.

On the other hand, if the solid imaging device 201 becomes larger, it is difficult to make a semiconductor device including the solid imaging device 201 smaller and lighter.

The same problems may arise if a structure in which a solid imaging device is located opposite a transparent plate, such as a glass plate, is adopted.

SUMMARY

According to an aspect of the embodiments, a semiconductor device includes: a solid imaging device having a light receiving region; gold bumps located around the light receiving region of the solid imaging device; and a transparent plate which covers the light receiving region of the solid imaging device and which is supported by the gold bumps.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Embodiments of the present invention will now be described in detail with reference to the drawings.

First Embodiment

Figure 1:
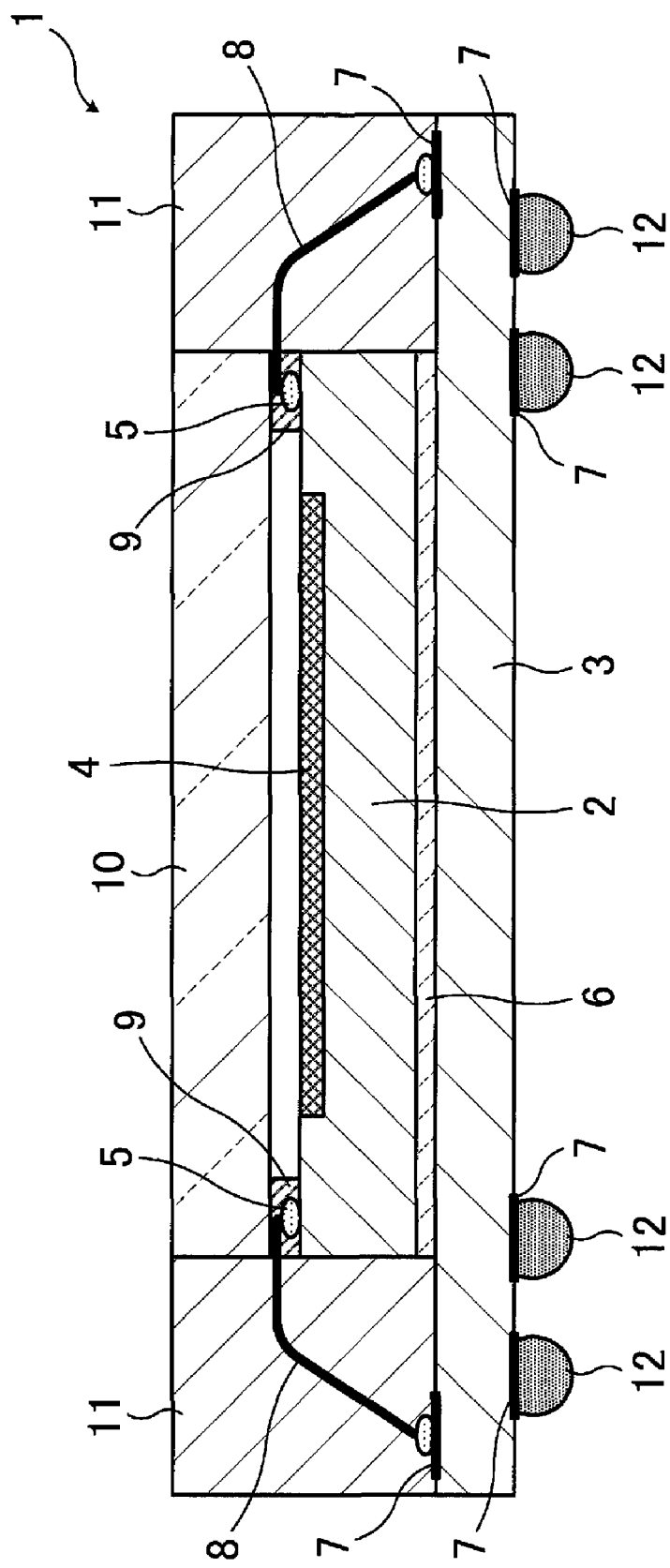
FIG. 1 is a schematic sectional view of a semiconductor device according to a first embodiment.

A semiconductor device according to a first embodiment is illustrated in FIG. 1.

With a semiconductor device 1 according to a first embodiment, a solid imaging device 2 is mounted over a circuit board 3.

The solid imaging device 2 includes a light receiving region 4 made up of many light receiving elements (photosensors) formed like an array in one principal plane of a semiconductor substrate of silicon or the like. A microlens (not illustrated) is located over the light receiving elements.

Electrode pads (not illustrated) are located outside the light receiving region 4 and gold bumps 5 which are gold (Au) ball bumps are located over the electrode pads.

A principal plane (reverse) of the solid imaging device 2 opposite to the principal plane in which the light receiving region 4 is formed and over which the gold bumps 5 are formed is fixed onto the circuit board 3 with a film-like adhesive 6.

Predetermined wiring patterns 7 are formed over both surfaces of the circuit board 3 or are formed in the circuit board 3 at need. An electrode and wiring pattern 7 formed on the solid imaging device 2 side and the gold bumps 5 formed over the solid imaging device 2 are connected by gold (Au) wires 8.

When this connection is made by the use of the gold wires 8, first bonding is performed on the electrode and wiring pattern 7 formed over the circuit board 3 and second bonding is performed on the gold bumps 5. At this time the gold wires 8 are located so that they will extend in a direction approximately parallel to the principal planes of the circuit board 3 near the gold bumps 5 to which their ends are connected.

Adhesives 9 for coating portions where the gold bumps 5 and the gold wires 8 are connected are located. A transparent plate-like substrate, such as a glass plate 10, which covers the light receiving region 4 of the solid imaging device 2 is made to adhere by the adhesives 9. As described later, the adhesives 9 are also located between the portions where the gold bumps 5 and the gold wires 8 are connected, and are linked together. That is to say, the adhesives 9 form the shape of a frame-like plane which surrounds the light receiving region 4.

Areas outside areas over the solid imaging device 2 where the adhesives 9 are located, sides of the solid imaging device 2, sides of the glass plate 10, and the gold wires 8 are sealed with sealing resin 11.

Solder balls are located under the wiring pattern 7 formed under the principal plane (reverse) of the circuit board 3 opposite to the principal plane over which the solid imaging device 2 is mounted as external connection terminals 12 used for mounting the semiconductor device 1 over a motherboard or the like.

With the semiconductor device 1 according to the first embodiment, as described above, the glass plate 10 is made to adhere over the solid imaging device 2 with the adhesives 9. At this time the adhesives 9 are located at portions where gold bumps 5 and the gold wires 8 are connected. The glass plate 10 is made to adhere with the adhesives 9.

An effect obtained by the semiconductor device 1 having the above structure will be described with reference to FIGS. 2 through 5.

Figure 2A:
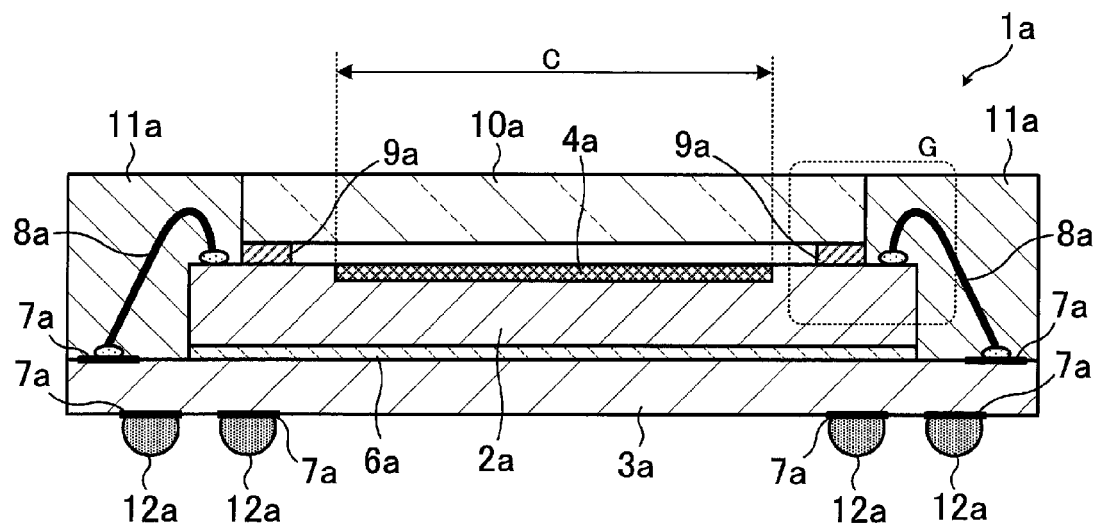
FIGS. 2A and 2B are views for describing an effect obtained by the semiconductor device according to the first embodiment, FIG. 2A being a schematic sectional view of the semiconductor device in which adhesives are formed inside portions where gold wires are connected, FIG. 2B being a schematic sectional view of the semiconductor device in which adhesives are formed at portions where gold bumps and gold wires are connected.

For the sake of comparison a semiconductor device in which adhesives are located inside portions where gold bumps and gold wires are connected is taken as an example and is illustrated in FIG. 2A as a semiconductor device 1a.

Figure 2B:
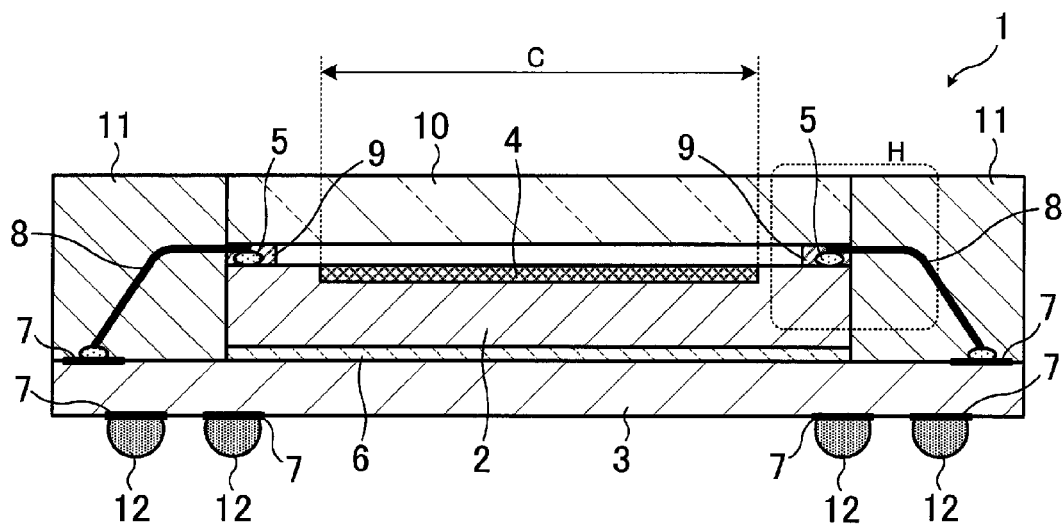

In the semiconductor devices 1 and 1a, as illustrated in FIGS. 2A and 2B, it is assumed that the light receiving region 4 of the solid imaging device 2 and a light receiving region 4a of a solid imaging device 2a are equal in size and that their size is C.

Figure 3A:
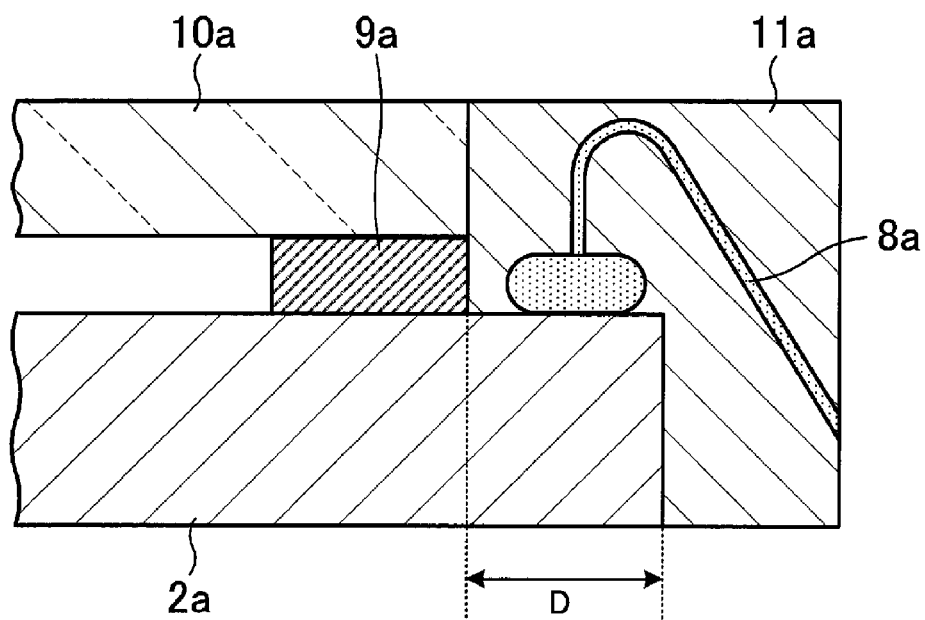
FIGS. 3A and 3B are views for describing the effect obtained by the semiconductor device according to the first embodiment, FIG. 3A being an enlarged view of a G area of FIG. 2A, FIG. 3B being an enlarged view of an H area of FIG. 2B.
Figure 3B:
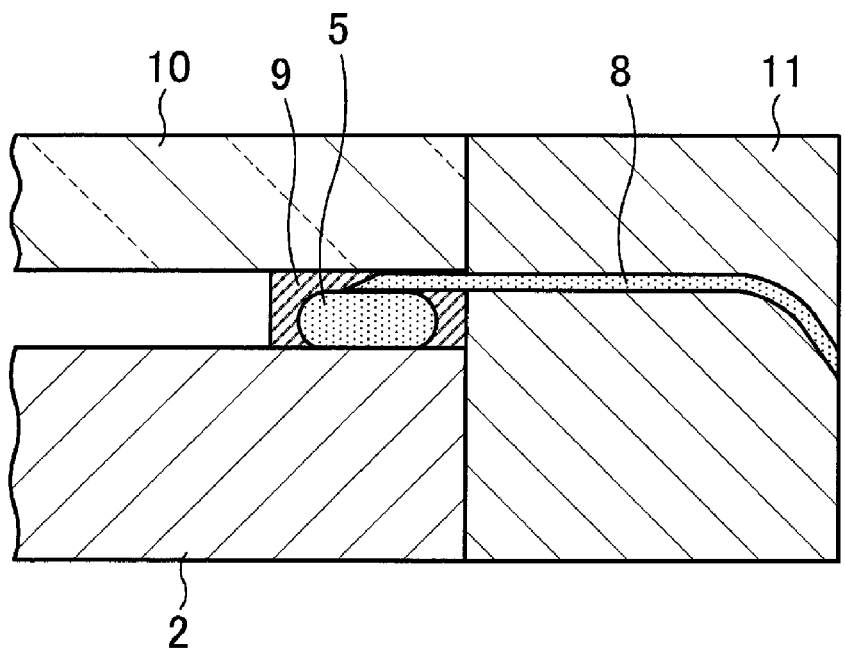

FIG. 3A is an enlarged view of a G area of FIG. 2A and FIG. 3B is an enlarged view of an H area of FIG. 2B.

The semiconductor device 1a has a structure in which the solid imaging device 2a having the light receiving region 4a is mounted over a circuit board 3a over which a predetermined wiring pattern 7a is formed. The solid imaging device 2a is fixed onto the circuit board 3a with a film-like adhesive 6a.

In the semiconductor device 1a having the above structure, electrode pads of the solid imaging device 2a and the wiring pattern 7a formed over the circuit board 3a are connected by gold wires 8a. When this connection is made by the use of the gold wires 8a, an ordinary wire bonding method is used. That is to say, first bonding is performed on the electrode pads of the solid imaging device 2a and second bonding is performed on the wiring pattern 7a.

In the semiconductor device 1a each adhesive 9a is located in an area between a portion where the electrode pad and the gold wire 8a are connected and the light receiving region 4a. A glass plate 10a which covers the light receiving region 4a is made to adhere by the adhesives 9a.

Areas where the gold wires 8a are located are sealed with sealing resin 11a.

Solder balls 12a are located under the wiring pattern 7a formed under a principal plane of the circuit board 3a opposite to a principal plane over which the solid imaging device 2a is mounted.

In the semiconductor device 1 according to the first embodiment illustrated in FIG. 2B, on the other hand, the adhesives 9 are located to coat the portions where the gold bumps 5 and the gold wires 8 are connected.

With the semiconductor device 1a, as illustrated in FIGS. 2A and 3A, it is necessary to secure a space between the portion where the gold wire 8a is connected and the light receiving region 4a for locating the adhesive 9a and to locate the portion where the gold wire 8a is connected in an area D from the edge of the solid imaging device 2a to the adhesive 9a.

With the semiconductor device 1 according to the first embodiment, as illustrated in FIGS. 2B and 3B, the adhesive 9 is located at the portion where the gold bump 5 and the gold wire 8 are connected to coat the portion.

Therefore, with the semiconductor device 1 according to the first embodiment the size of the solid imaging device 2 can be reduced by width corresponding to the area D of FIG. 3A, compared with the solid imaging device 2a.

Figure 4A:
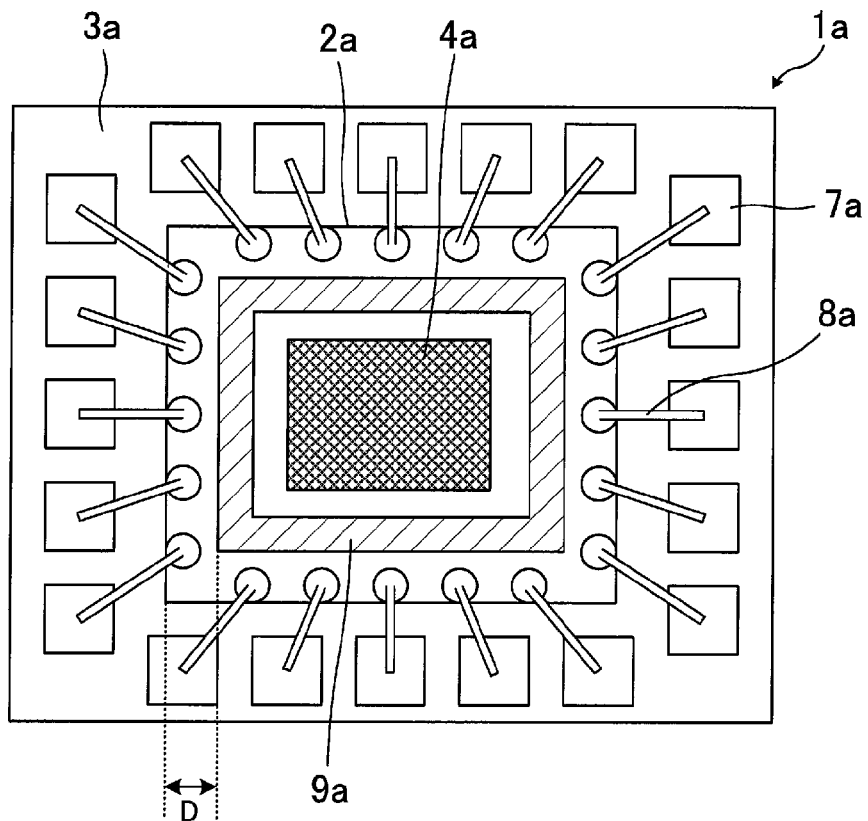
FIGS. 4A and 4B are views for describing an effect obtained by the semiconductor device according to the first embodiment, FIG. 4A being a schematic plan view of the semiconductor device in which the adhesives are formed inside the portions where the gold wires are connected, FIG. 4B being a schematic plan view of the semiconductor device in which the adhesives are formed at the portions where the gold bumps and the gold wires are connected.
Figure 4B:
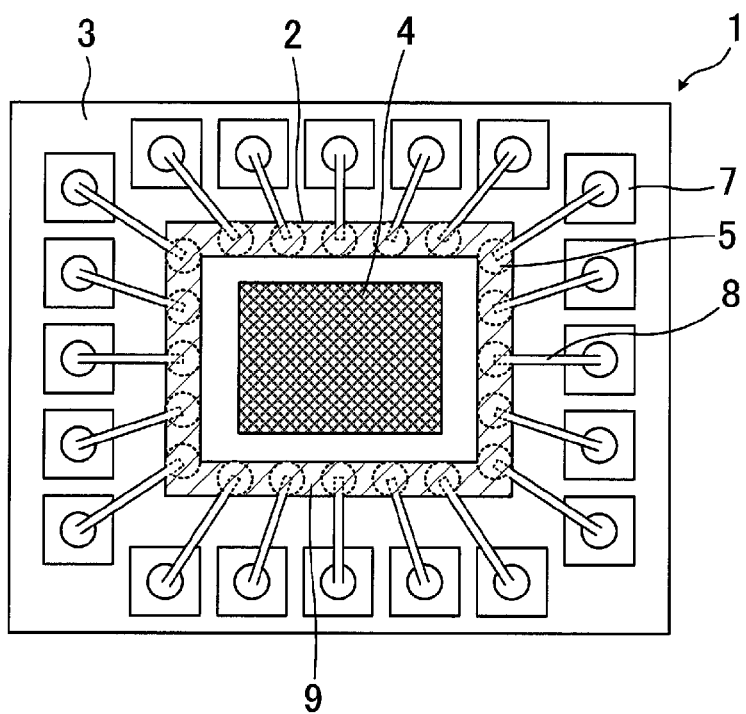

FIG. 4A illustrates the shape viewed from above of the semiconductor device illustrated in FIG. 2A. FIG. 4B illustrates the shape viewed from above of the semiconductor device according to the first embodiment illustrated in FIG. 2B.

The glass plates 10a and 10 and the sealing resin 11a and 11 are not illustrated in FIGS. 4A and 4B respectively.

With the semiconductor device 1a illustrated in FIG. 4A, electrode pads are located around the light receiving region 4a of the solid imaging device 2a and are connected to the wiring pattern 7a formed over the circuit board 3a by the gold wires 8a. The adhesive 9a is located in an area between the light receiving region 4a and gold bumps 5a connected to the electrode pads (area of FIG. 4A indicated by oblique lines).

With the semiconductor device 1 according to the first embodiment illustrated in FIG. 4B, on the other hand, the gold bumps 5 are formed around the light receiving region 4 of the solid imaging device 2 and the gold wires 8 are connected to the gold bumps 5 for connecting the gold bumps 5 to the wiring pattern 7 formed over the circuit board 3. The adhesive 9 are located to coat the portions where the gold bumps 5 and the gold wires 8 are connected and to fill in a space between adjacent connection portions (area of FIG. 4B indicated by oblique lines).

With the semiconductor device 1 illustrated in FIG. 4B, positions where the gold bumps 5 are located can be shifted to positions where the adhesive 9a is located in the semiconductor device 1a illustrated in FIG. 4A.

That is to say, with the semiconductor device 1 the solid imaging device 2 can be made small by area corresponding to the area D, compared with the semiconductor device 1a. Accordingly, the size of the external form (size) of the solid imaging device 2 can be reduced.

Figure 5A:
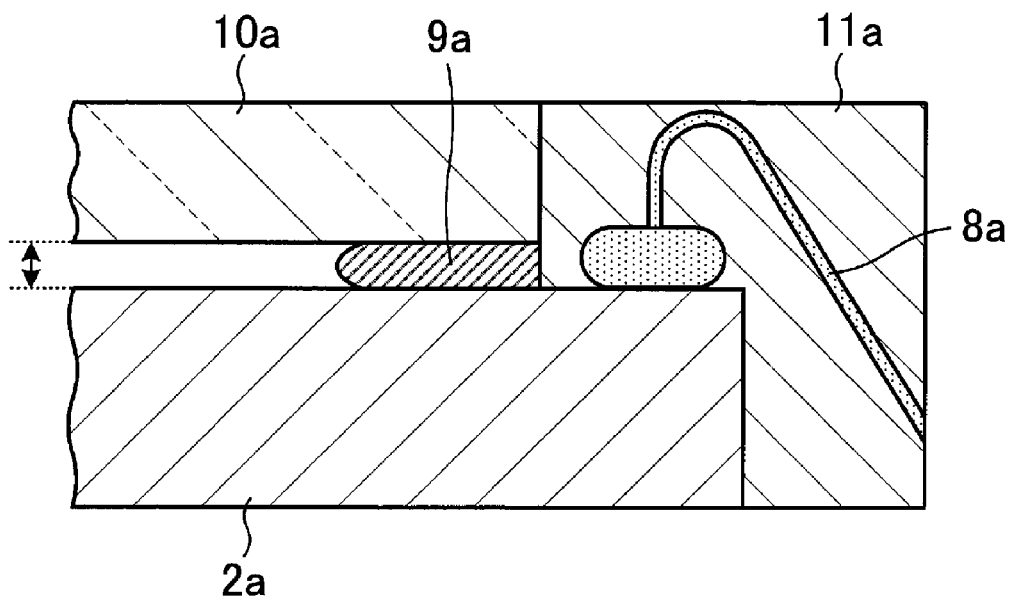
FIGS. 5A and 5B are views for describing an effect obtained by the semiconductor device according to the first embodiment, FIG. 5A being a view describing the seal state of the semiconductor device in which the adhesives are formed inside the portions where the gold wires are connected, FIG. 5B being a view describing the seal state of the semiconductor device in which the adhesives are formed at the portions where the gold bumps and the gold wires are connected.
Figure 5B:
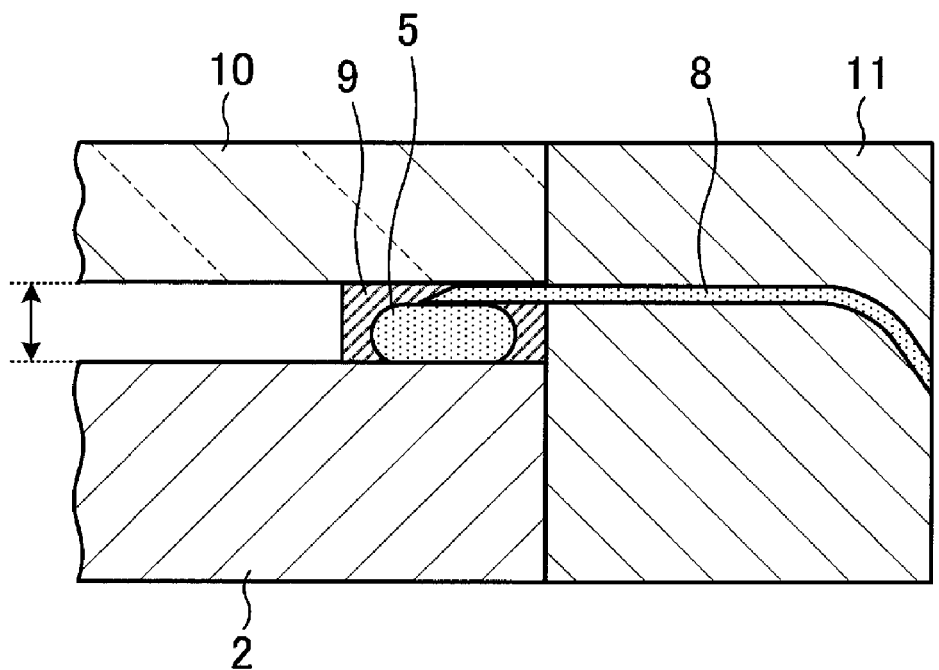

FIG. 5A illustrates the state of the semiconductor device 1a in which the adhesives 9a are located inside the portions where the gold wires are connected at the time of sealing. FIG. 5B illustrates the state of the semiconductor device 1 according to the first embodiment in which the adhesives 9 are located at the portions where the gold bumps and the gold wires are connected at the time of sealing.

When the semiconductor device 1a is fabricated, the electrode pads of the solid imaging device 2a and the circuit board 3a are connected by the gold wires 8a. Then the glass plate 10a is made to adhere by the adhesives 9a and an area where the gold wires 8a and the like are located is sealed with the sealing resin 11a by the use of a predetermined metal mold.

At this time the adhesive 9a is located between the portion where the electrode pad and the gold wire 8a are connected and the light receiving region 4a. Therefore, the glass plate 10a may be pushed toward the solid imaging device 2a by pressure in the metal mold, depending on conditions under which sealing is performed with the sealing resin 11a and a material for the adhesive 9a. In this case, the adhesive 9a may be deformed significantly (see FIG. 5A).

A space is needed between the solid imaging device 2a and the glass plate 10a. The reason for this is to leave a layer of air which differs from the microlens of resin in refractive index between the solid imaging device 2a and the glass plate 10a, while controlling the vertical size of the semiconductor device 1a.

As stated above, however, if the adhesive 9a is deformed by pressure in the metal mold, a space between the solid imaging device 2a and the glass plate 10a becomes narrow or the adhesive 9a flows toward the light receiving region 4a. As a result, desired optical characteristics may not be obtained.

With the semiconductor device 1 according to the first embodiment illustrated in FIG. 5B, on the other hand, the portion where the gold bump 5 and the gold wire 8 are connected is between the glass plate 10 and the solid imaging device 2. By controlling the size (height) of the gold bump 5, a space between the glass plate 10 and the solid imaging device 2 can be controlled. In addition, the gold bump 5 is made of metal, so its mechanical strength is high.

Therefore, even if pressure in the metal mold is applied to the glass plate 10 at the time of performing sealing with the sealing resin 11, the portion where the gold bump 5 and the gold wire 8 are connected effectively controls excessive deformation of the adhesive 9 or a change in the space between the solid imaging device 2 and the glass plate 10.

As a result, a predetermined space can be secured and maintained between the glass plate 10 and the solid imaging device 2.

Accordingly, it is possible to realize the small light semiconductor device 1 without deteriorating its optical characteristics.

A method for fabricating the semiconductor device 1 will now be described.

First a plurality of solid imaging devices 2 and a large-sized (large) circuit board 3 over which predetermined wiring patterns 7 are formed are prepared. The plurality of solid imaging devices 2 are made to adhere to predetermined positions of the circuit board 3 by the use of a film-like adhesive 6 (see FIG. 6).

Figure 6:
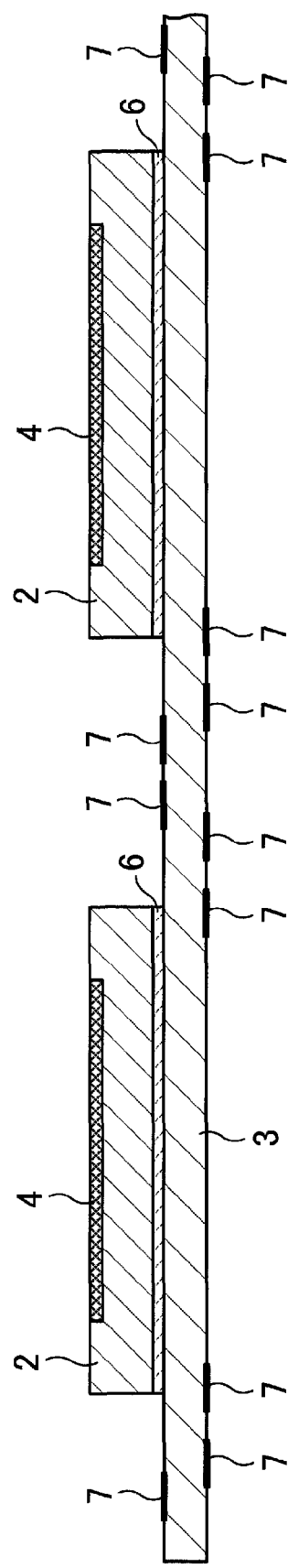
FIG. 6 is a fragmentary schematic sectional view describing the step of bonding by the use of a film-like adhesive included in a method for fabricating the semiconductor device according to the first embodiment.

FIG. 6 illustrates a state in which the plurality of solid imaging devices 2 are made to adhere to the circuit board 3.

Figure 7:
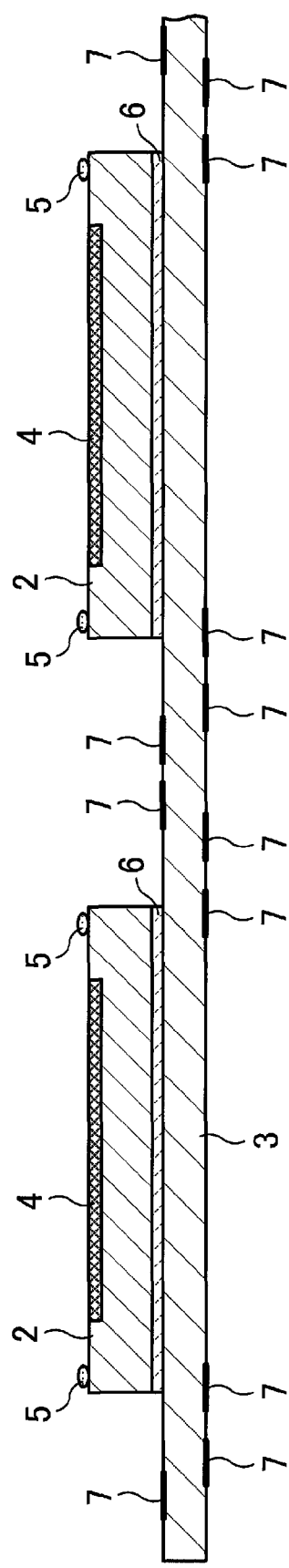
FIG. 7 is a fragmentary schematic sectional view describing the step of forming gold bumps included in the method for fabricating the semiconductor device according to the first embodiment.

Then gold bumps 5 are located over electrode pads (not illustrated) located over surfaces of the solid imaging devices 2 in which light receiving regions 4 are formed (see FIG. 7).

The gold bumps 5 can be formed by a wire bonding method.

For example, a gold wire is connected to the electrode pad by what is called a wire bonding method. A predetermined electric current is passed through the gold wire to burn off its tip. Ultrasonic waves are directed under the conditions of predetermined pressure and heat (ultrasonic compression). By doing so, the gold bumps 5 are formed. In this case, the size of the gold bumps 5 can be controlled by controlling an electric current passed through the gold wire and pressure, heat, and ultrasonic waves at the time of the ultrasonic compression.

As described later, a space between the solid imaging device 2 and a glass plate located over the solid imaging device 2 can be controlled by controlling the size of the gold bumps 5.

Figure 8:
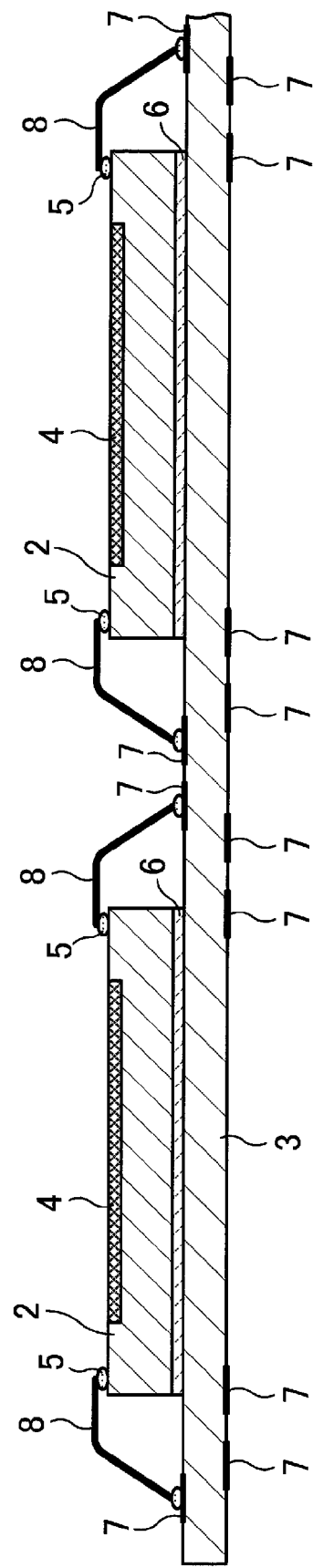
FIG. 8 is a fragmentary schematic sectional view describing the step of forming gold wires included in the method for fabricating the semiconductor device according to the first embodiment.

Then the gold bumps 5 formed over the solid imaging devices 2 and electrodes and the wiring patterns 7 formed over the circuit board 3 are connected by gold wires 8 (see FIG. 8).

At this time first bonding is performed on the electrodes and the wiring patterns 7 formed over the circuit board 3 and second bonding is performed on the gold bumps 5 formed over the solid imaging devices 2. By using this bonding method, the gold wires 8 can be formed so that they will extend in a direction approximately parallel to the circuit board 3 near the gold bumps 5.

The gold wires 8 are connected to the gold bumps 5 of certain thickness (height) and extend in a direction approximately parallel to the surface of the circuit board 3. As a result, the gold wires 8 do not touch edge portions of the solid imaging devices 2. Accordingly, the gold wires 8 are not curved or cut.

In addition, the ends of the gold wires 8 are connected to the gold bumps 5 located over the electrode pads located over the solid imaging devices 2, so the gold wires 8 do not cause damage to the electrode pads.

Figure 9:
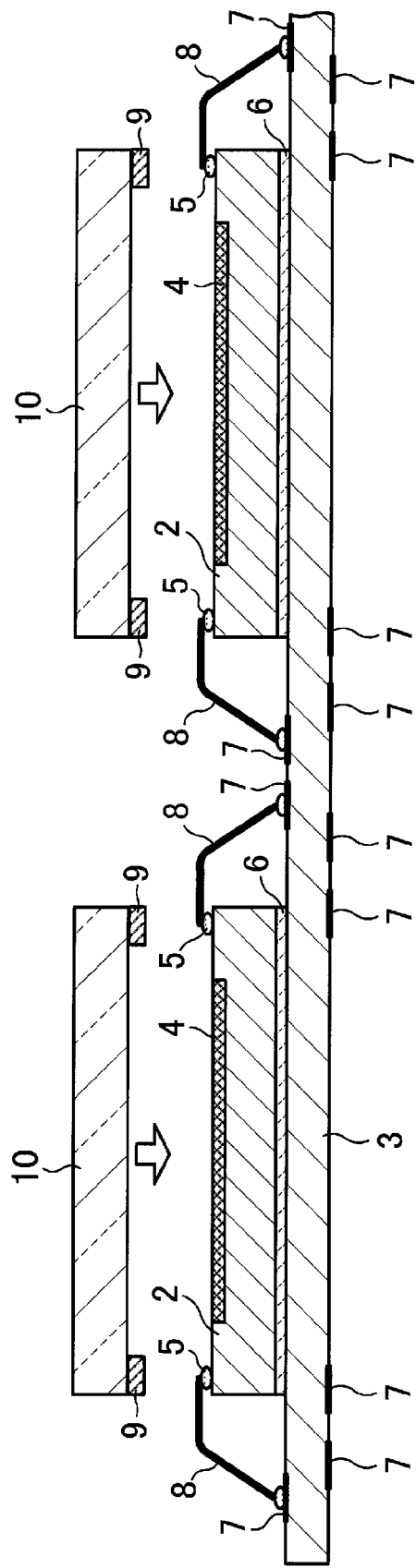
FIG. 9 is a fragmentary schematic sectional view describing the step of mounting glass plates included in the method for fabricating the semiconductor device according to the first embodiment.

Then glass plates 10 over one principal plane of each of which an adhesive 9 is selectively located are placed over the solid imaging devices 2 (see FIG. 9).

In this case, the glass plates 10 used are formed in advance so that their size will correspond to the size of the solid imaging devices 2.

The adhesives 9 are applied in advance to regions of the glass plates 10 which are opposite to portions where the gold bumps 5 and the gold wires 8 are connected at the time of the glass plates 10 being bonded to the solid imaging devices 2.

The principal planes of the glass plates 10 over which the adhesives 9 are selectively located are stuck to the portions of the solid imaging devices 2 where the gold bumps 5 and the gold wires 8 are connected.

It is a matter of course that the glass plates 10 may be bonded to the portions of the solid imaging devices 2 at which the gold bumps 5 and the gold wires 8 are connected and to which the adhesives 9 are applied in advance.

In both cases, the adhesives 9 located surround the light receiving regions 4 of the solid imaging devices 2.

A UV-hardening acrylic type adhesive, a heat-hardening epoxy type adhesive, or the like can be used as the adhesives 9 used for bonding the glass plates 10 to the solid imaging devices 2. The adhesives 9 are selected on the basis of adhesion, heat resistance, hardness, and the like.

Figure 10:
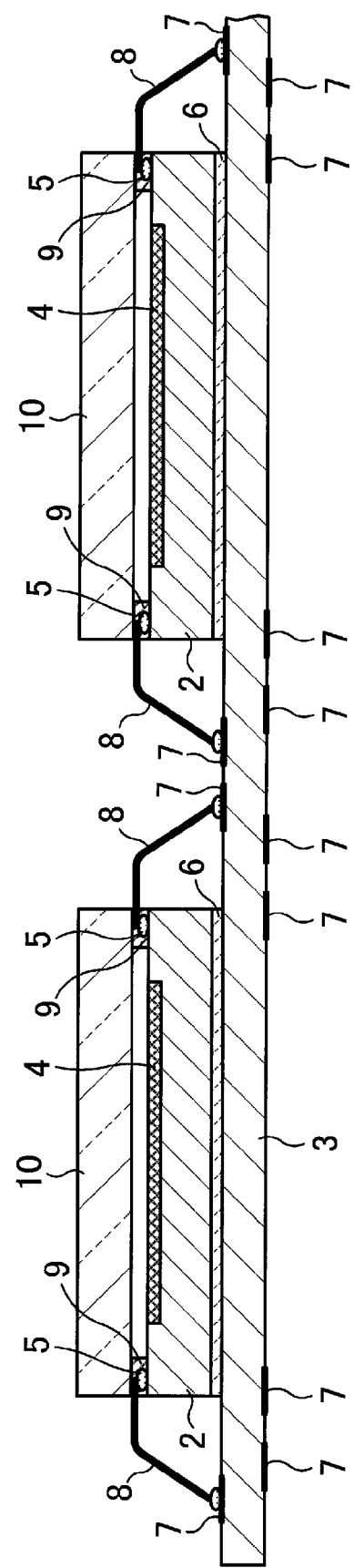
FIG. 10 is a fragmentary schematic sectional view describing the step of hardening an adhesive included in the method for fabricating the semiconductor device according to the first embodiment.

Then the adhesives 9 are hardened by a predetermined method according to their material. As a result, the glass plates 10 adhere over the portions where the gold bumps 5 and the gold wires 8 are connected (see FIG. 10).

Figure 11:
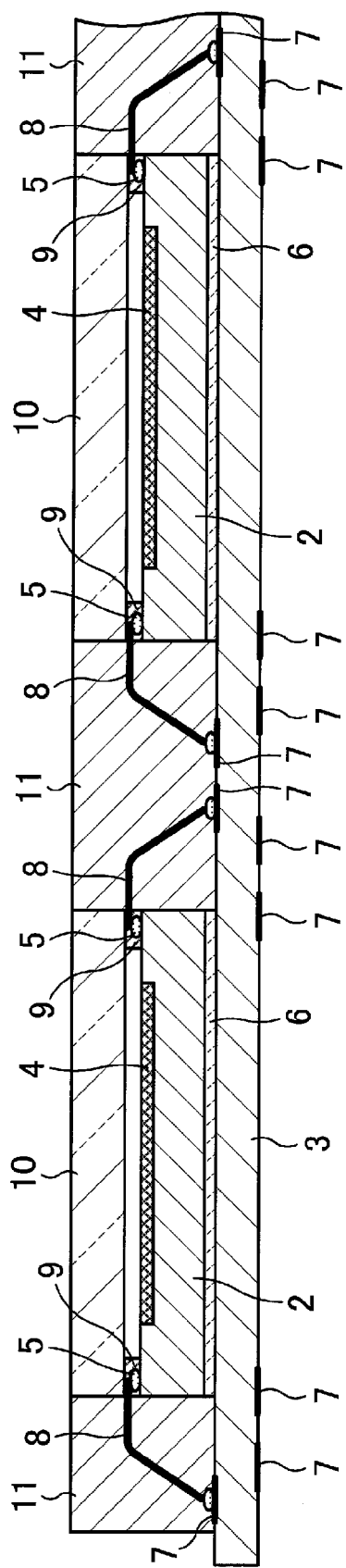
FIG. 11 is a fragmentary schematic sectional view describing the step of sealing by the use of resin included in the method for fabricating the semiconductor device according to the first embodiment.

Then areas between adjacent solid imaging devices 2 where the gold wires 8 and the like are located are sealed with sealing resin 11 except over the glass plates 10 (see FIG. 11).

At this time the portions where the gold bumps 5 and the gold wires 8 are connected are under the glass plates 10. Therefore, even if pressure in a metal mold is applied, spaces corresponding to the thickness (height) of the portions where the gold bumps 5 and the gold wires 8 are connected are secured between the solid imaging devices 2 and the glass plates 10.

Figure 12:
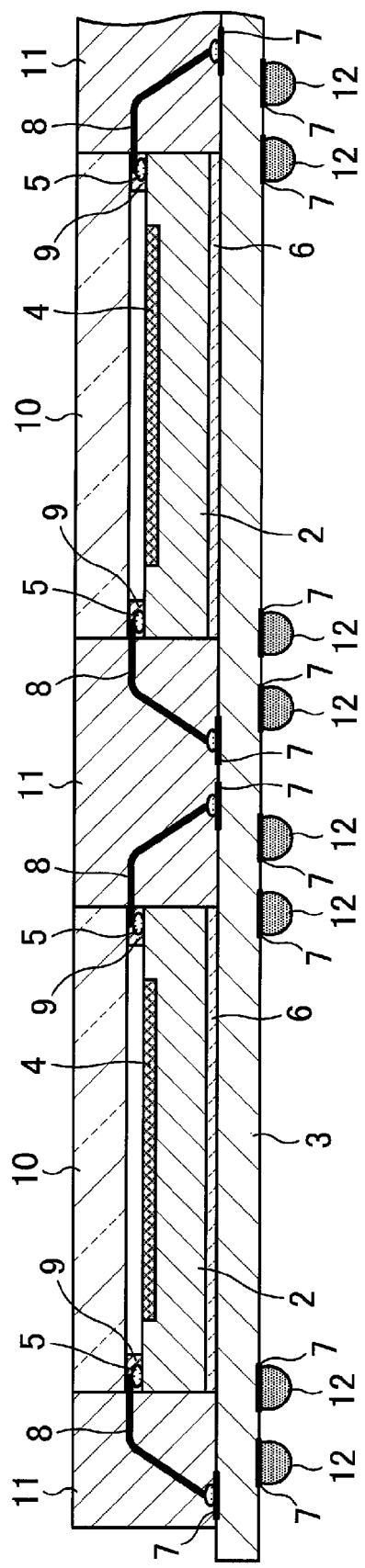
FIG. 12 is a fragmentary schematic sectional view describing the step of forming solder balls included in the method for fabricating the semiconductor device according to the first embodiment.

Then solder balls are located under the wiring pattern 7 formed under a principal plane (reverse) of the circuit board 3 opposite to the principal plane over which the solid imaging devices 2 are mounted as external connection terminals 12 (see FIG. 12).

Figure 13:
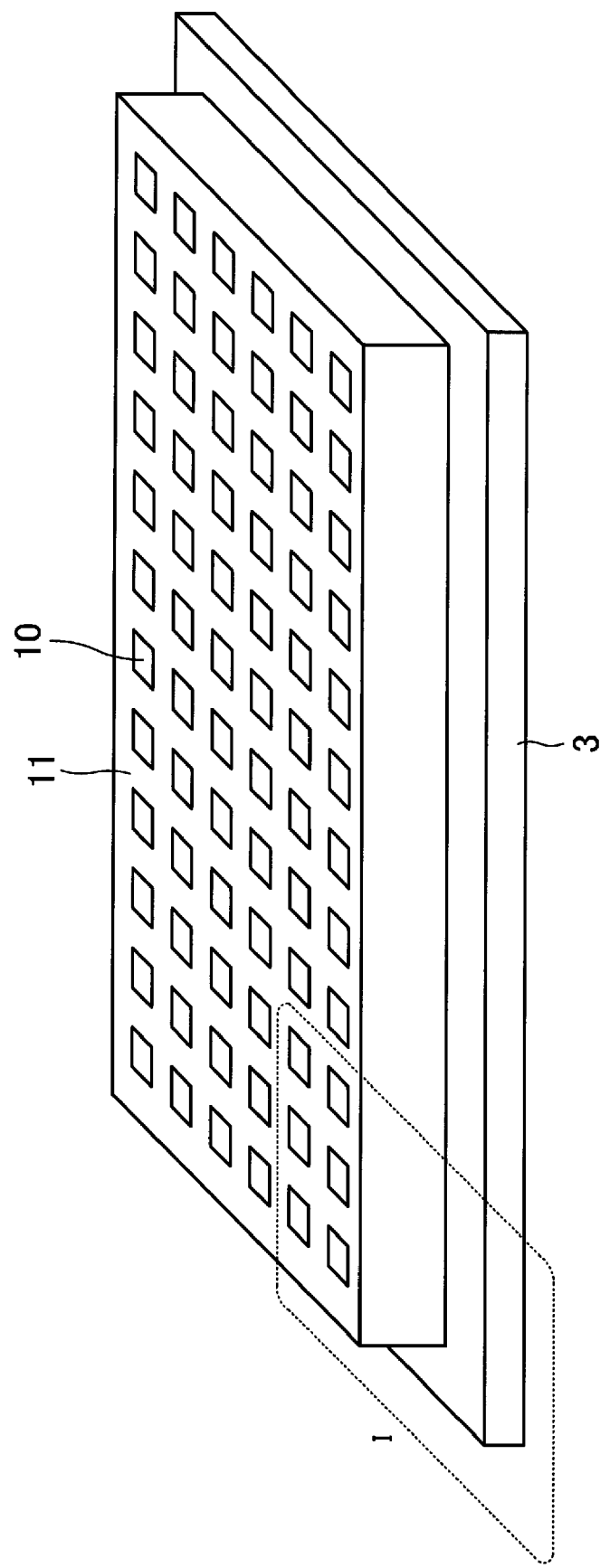
FIG. 13 is a perspective view describing an aggregate of the semiconductor devices according to the first embodiment after the formation of solder balls.

By following the above fabrication procedure, an aggregate of semiconductor devices 1 in which the plurality of solid imaging devices 2 are located over the large-sized circuit board 3 and in which the glass plate 10 is located over each solid imaging device 2 is obtained. This state is illustrated in FIG. 13.

Figure 14:
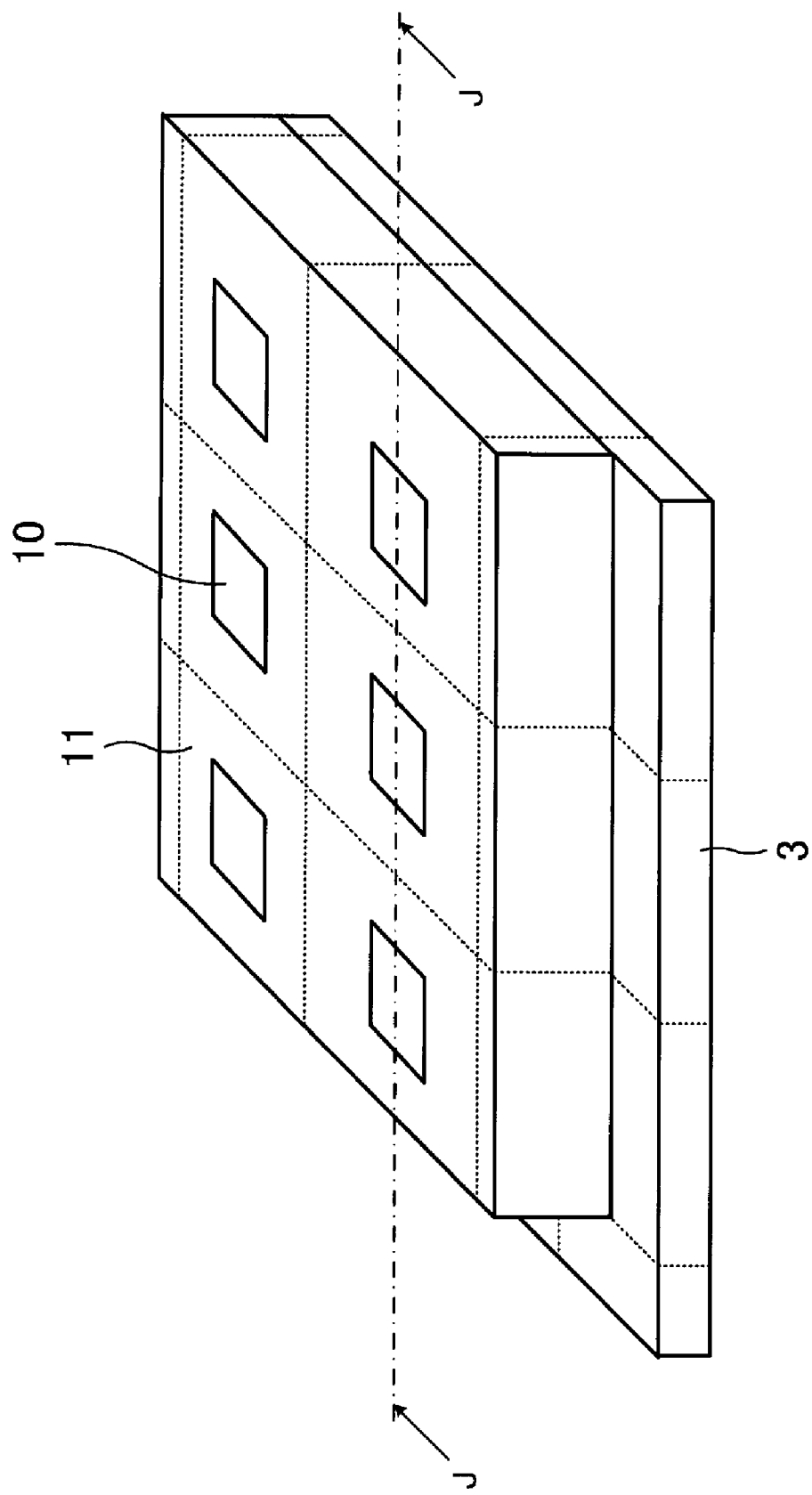
FIG. 14 is an enlarged perspective view of an I area of FIG. 13.
Figure 15:
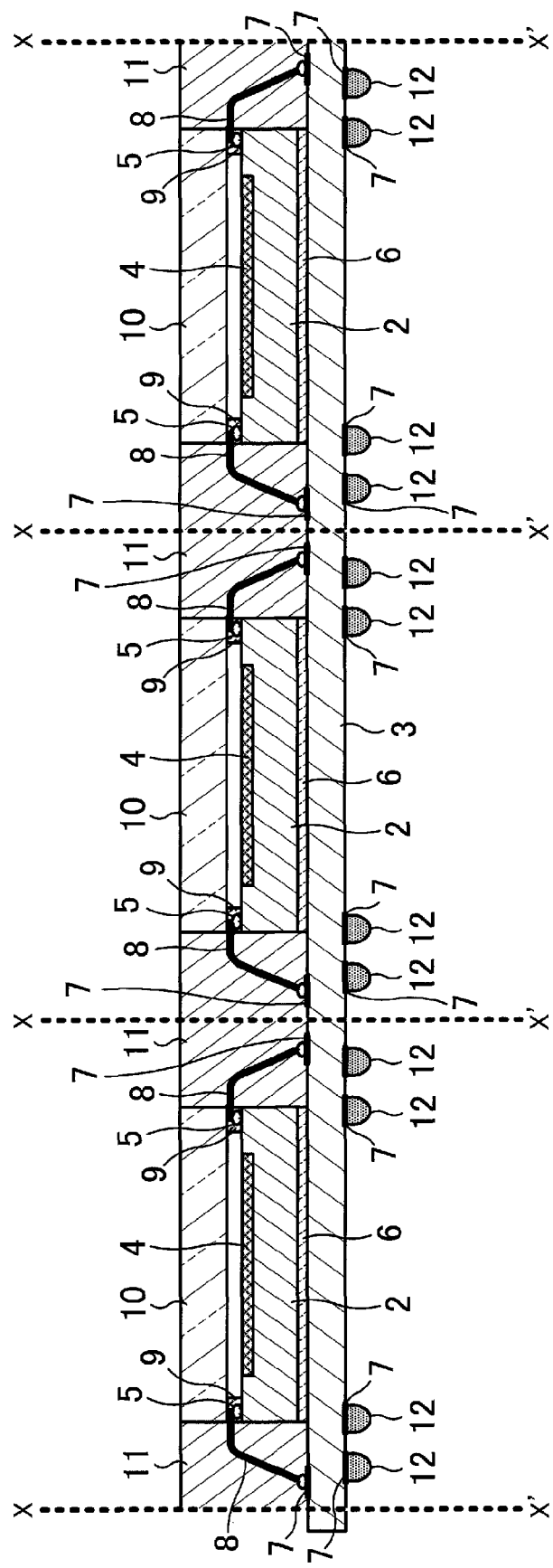
FIG. 15 is a schematic sectional view taken along lines J-J of FIG. 14.

After that, a blade (not illustrated) is used for cutting (dicing) the sealing resin 11 and the circuit board 3 between adjacent solid imaging devices 2 in the X and Y directions along dotted lines X-X' of FIG. 15. By doing so, the aggregate of semiconductor devices 1 is separated into individual semiconductor devices 1 (see FIGS. 14 and 15).

An optical module is formed by mounting a holder which holds a lens, an infrared ray (IR) filter, and the like over the above semiconductor device 1.

That is to say, when the above semiconductor device 1 is mounted in an electronic apparatus, a holder including an optical lens is located over the semiconductor device 1 for effectively leading light to the light receiving regions 4.

Figure 16:
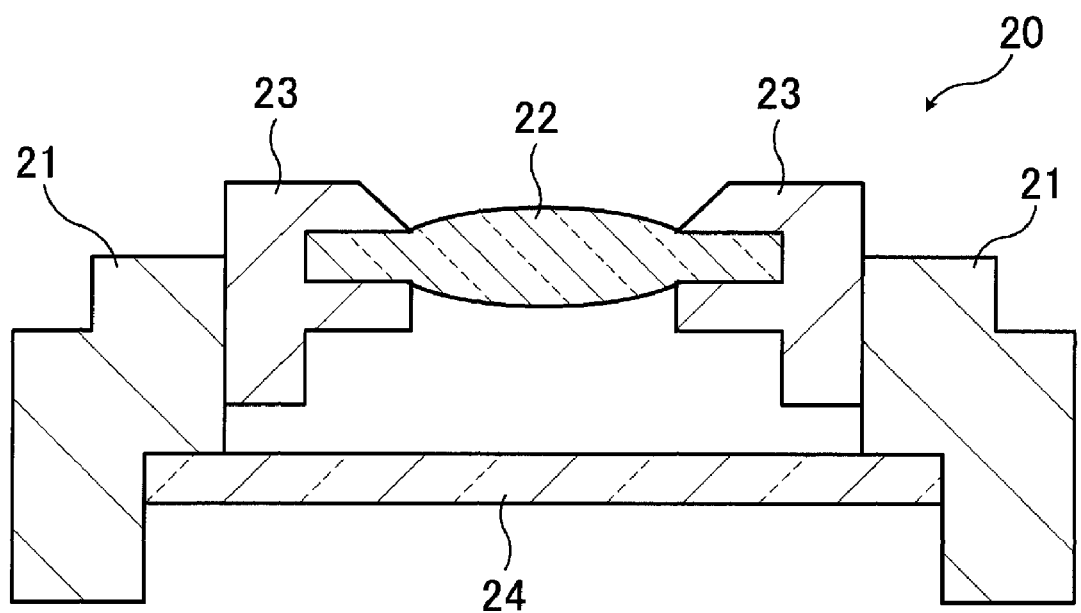
FIG. 16 is a schematic sectional view of a holder.

An example of the structure of the holder is illustrated in FIG. 16. A state in which the holder is mounted over the semiconductor device 1 is illustrated in FIG. 17.

As illustrated in FIG. 16, a holder 20 has a structure in which a barrel 23 to which a lens 22 is fixed is fixed in an enclosure 21. In addition, an infrared ray (IR) filter 24 is fixed in the enclosure 21.

Figure 17:
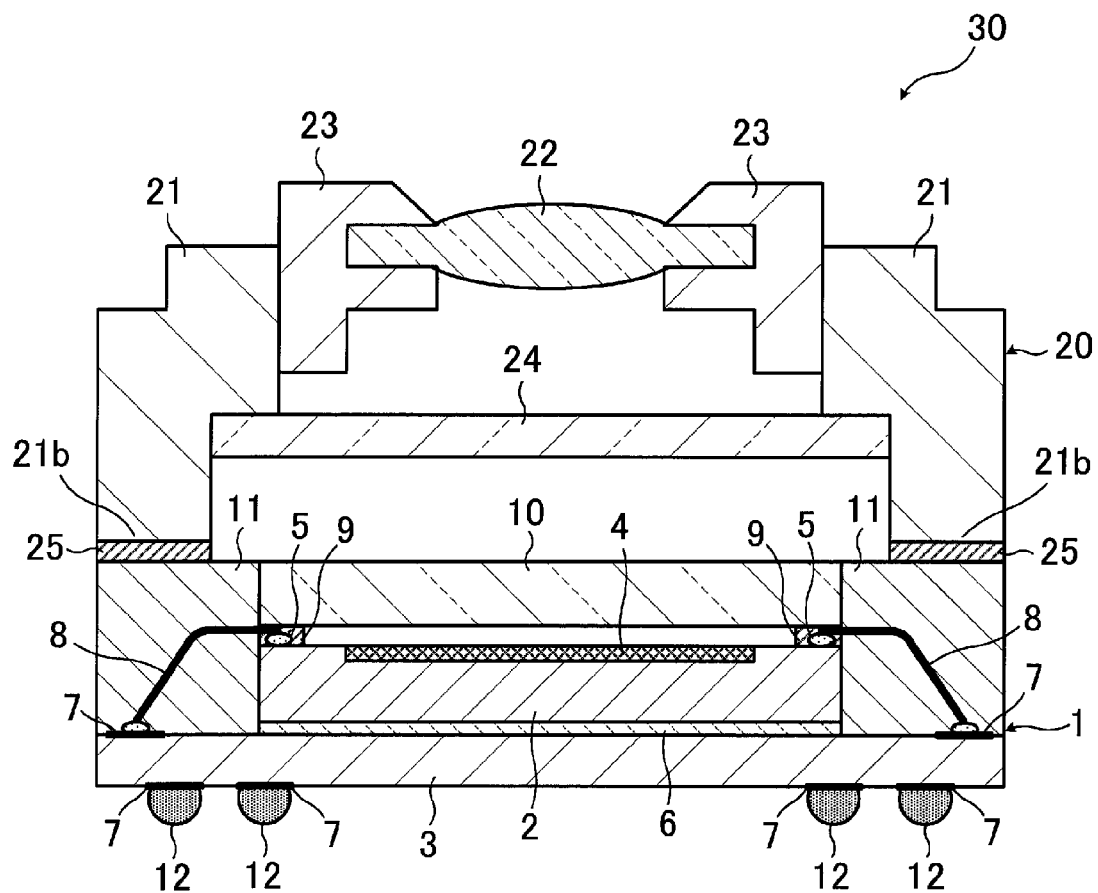
FIG. 17 is a schematic sectional view of an optical module using the semiconductor device according to the first embodiment.

As illustrated in FIG. 17, an adhesive 25 is applied to lower end portions 21b of the enclosure 21 of the holder 20 and the lower end portions 21b are bonded to a seal portion of the semiconductor device 1 formed by the use of the resin 11. When the holder 20 is bonded to the seal portion of the semiconductor device 1, the optical axis of the light receiving regions 4 of the semiconductor device 1 is aligned with the optical axis of the lens 22 of the holder 20. By doing so, an optical module 30 is formed.

The semiconductor device 1 is small and light, so the holder 20 mounted over the semiconductor device 1 can be made small. As a result, a smaller and lighter optical module 30 is formed.

In this example, the holder 20 is mounted directly over the semiconductor device 1. However, various modifications of the holder 20 can be proposed and any of them can be selected.

Figure 18:
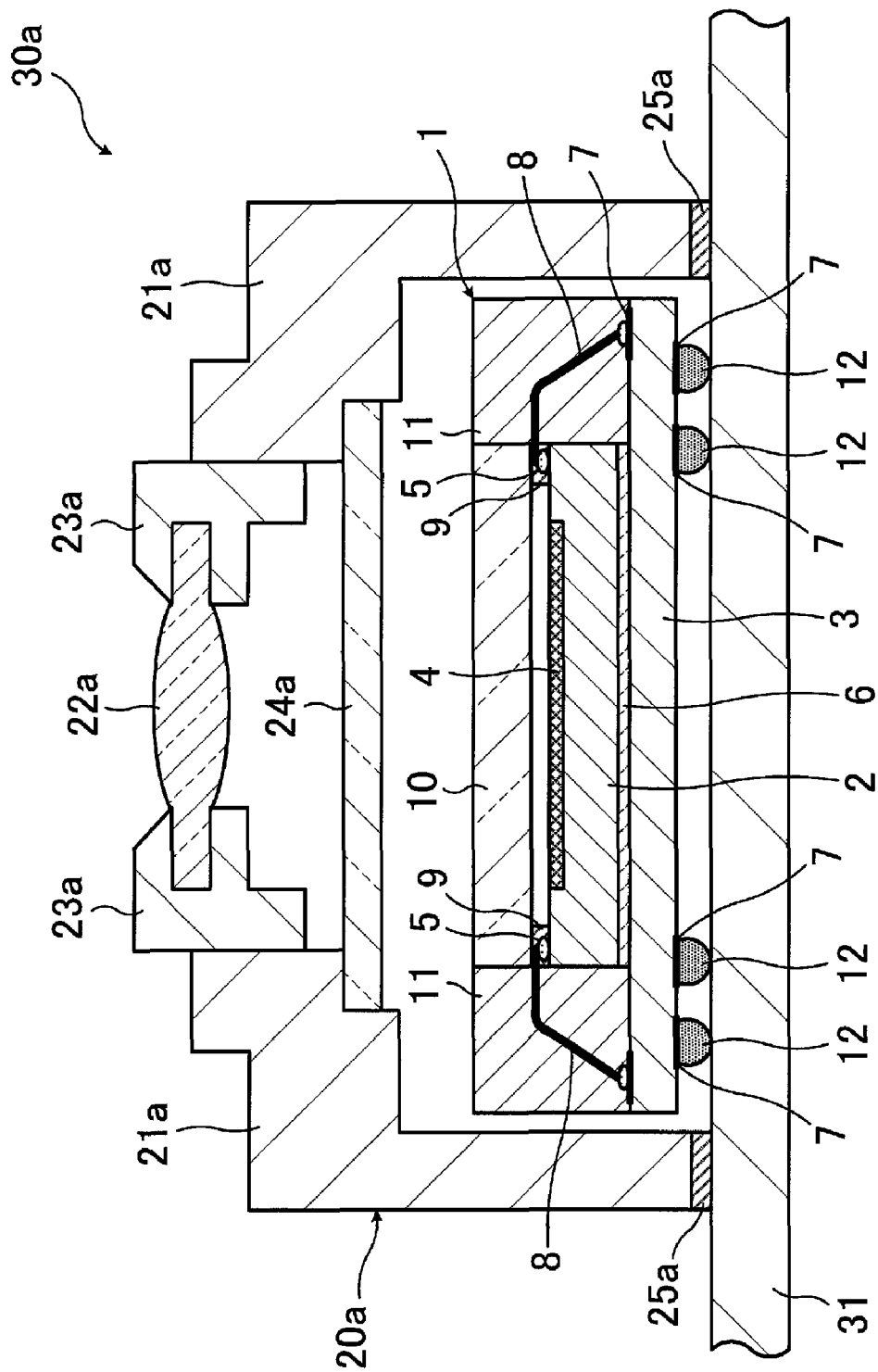
FIG. 18 is a schematic sectional view of another optical module using the semiconductor device according to the first embodiment.

As illustrated in FIG. 18, for example, the semiconductor device 1 is mounted over a motherboard 31 with the solder balls 12 between. Then a holder 20a which covers the semiconductor device 1 and which is fixed onto the motherboard 31 can be used.

With the holder 20a having the above structure, a barrel 23a to which a lens 22a is fixed is fixed in an enclosure 21a which is sufficiently large to cover the semiconductor device 1, and an infrared ray (IR) filter 24a is fixed in the enclosure 21a.

Lower end portions of the enclosure 21a of the holder 20a are fixed onto the motherboard 31 with an adhesive 25a. By doing so, an optical module 30a is formed.

If the above holder 20a which covers the semiconductor device 1 is used, the optical module 30a is large compared with the optical module 30 using the holder 20 mounted directly over the semiconductor device 1.

Second Embodiment

Figure 19:
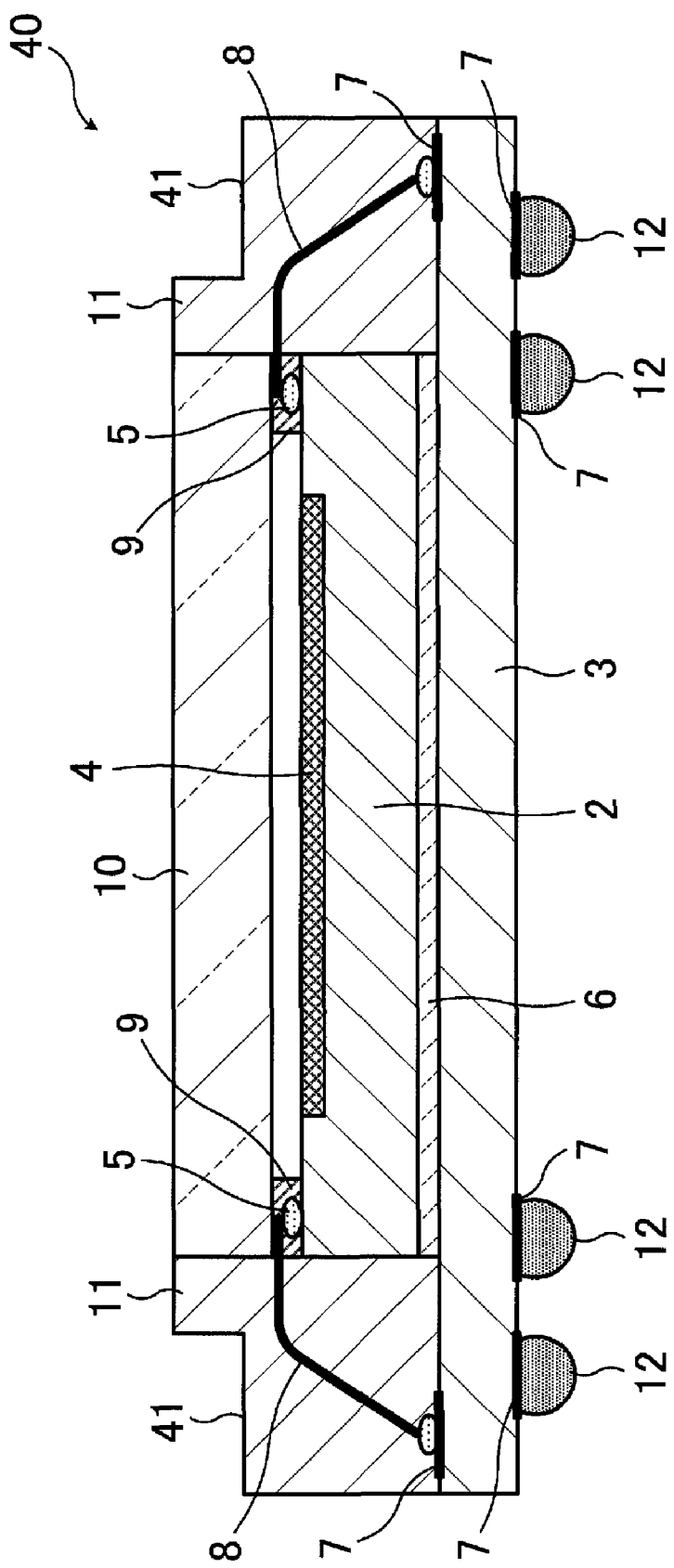
FIG. 19 is a schematic sectional view of a semiconductor device according to a second embodiment.
Figure 20:
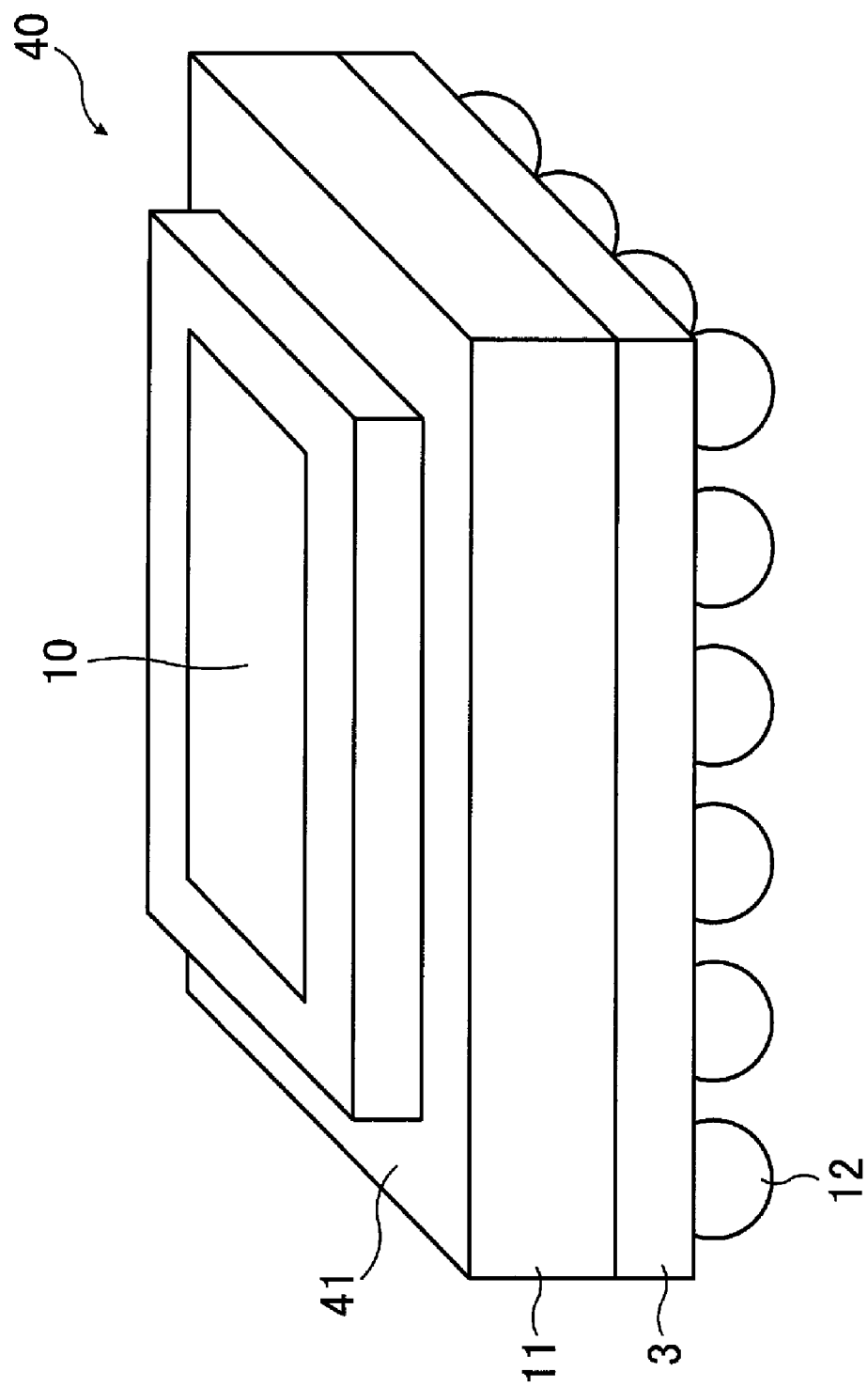
FIG. 20 is a perspective view of the semiconductor device according to the second embodiment.

A second embodiment will now be described by using FIGS. 19 and 20.

The same components that are described in the above first embodiment will be marked with the same symbols and detailed descriptions of them will be omitted.

With a semiconductor device 40 according to a second embodiment, step portions 41 are formed in the surface of sealing resin 11 used for sealing areas where gold wires 8 and the like are located.

The step portions 41 of the semiconductor device 40 are used at the time of mounting the holder 20 illustrated in FIG. 16.

Figure 21:
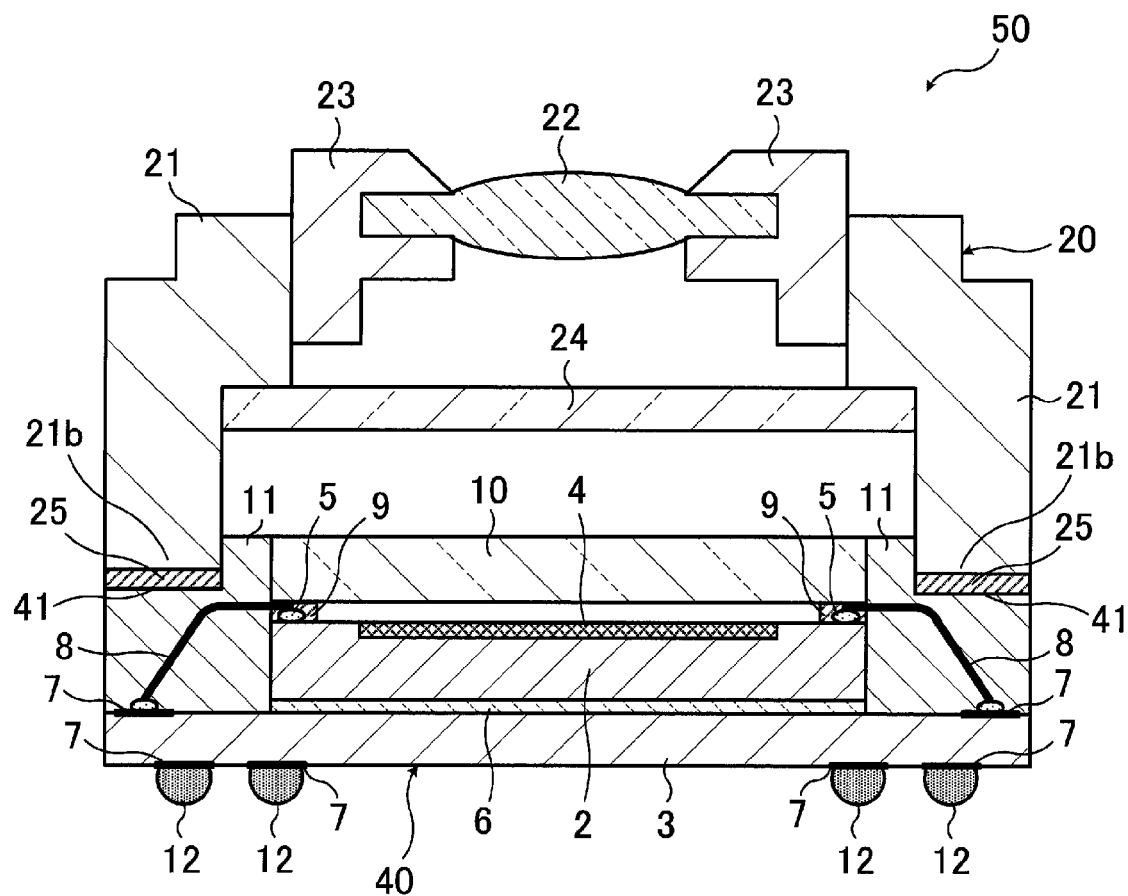
FIG. 21 is schematic sectional view of an optical module using the semiconductor device according to the second embodiment.

An optical module using the semiconductor device 40 according to the second embodiment is illustrated in FIG. 21.

The lower end portions 21b of the enclosure 21 of the holder 20 are fitted into the step portions 41 of the semiconductor device 40. By doing so, the holder 20 can be mounted over the semiconductor device 40 without positional deviation.

Therefore, by forming the step portions 41 and the enclosure 21 with the optical axes of the light receiving region 4 of the solid imaging device 2 and the lens 22 of the holder 20 and the distance between the light receiving region 4 of the solid imaging device 2 and the lens 22 of the holder 20 taken into consideration, an optical module 50 can be formed without deviation between the optical axes of the light receiving region 4 of the solid imaging device 2 and the lens 22 of the holder 20.

In addition, by forming the step portions 41 of the semiconductor device 40 and the corresponding lower end portions 21b of the enclosure 21 of the holder 20, the area of contact of the semiconductor device 40 with the holder 20 increases. This effectively prevents moisture or the like from entering between the semiconductor device 40 and the holder 20.

A method for fabricating the semiconductor device 40 according to the second embodiment will be described.

When the semiconductor device 40 according to the second embodiment is fabricated, the steps which are illustrated in FIGS. 6 through 12 and which are included in the method for fabricating the above semiconductor device 1 according to the first embodiment are also applied in the same way.

The following steps will now be described.

Figure 22:
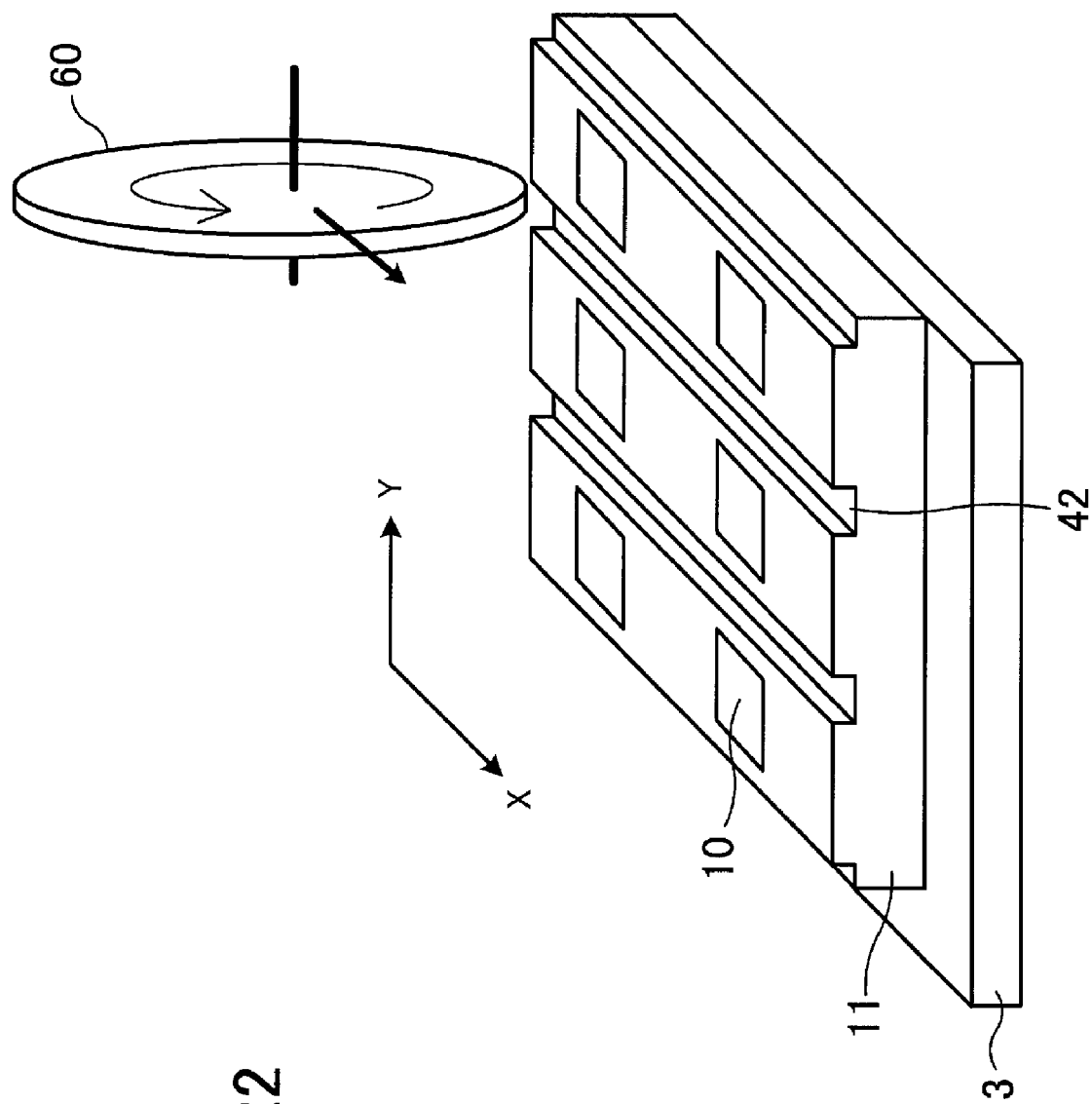
FIG. 22 is a fragmentary perspective view describing the step of forming first grooves included in a method for fabricating the semiconductor device according to the second embodiment.

After solder balls 12 are located under the reverse of a circuit board 3, a blade 60 having predetermined width (width of about 0.8 to 1.0 mm, for example) is used for cutting a groove 42 in one direction (X direction) in resin 11 between adjacent solid imaging devices 2 (between adjacent glass plates 10) (see FIG. 22).

The depth of the groove 42 is, for example, about 300 μm.

Figure 23:
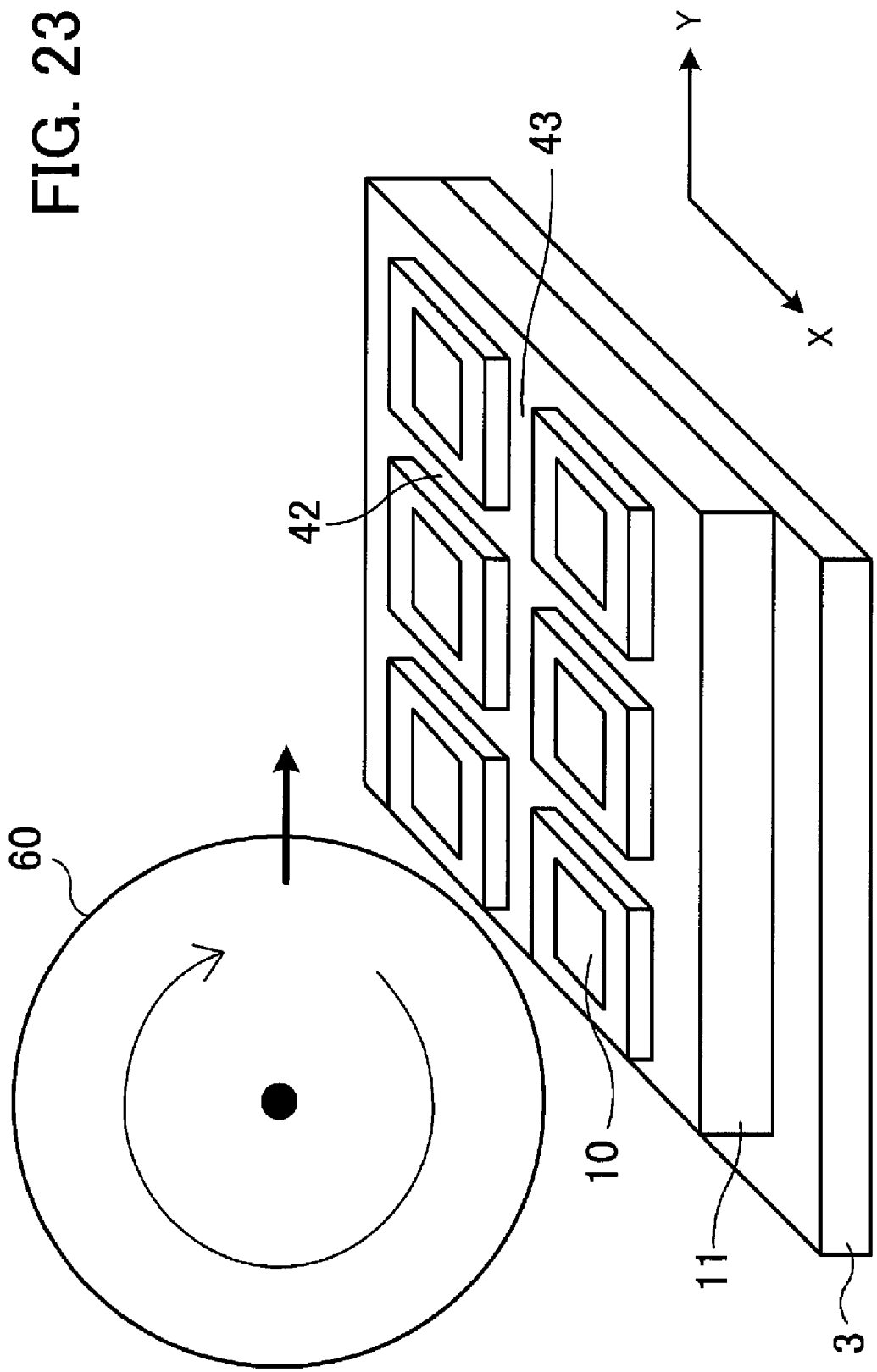
FIG. 23 is a fragmentary perspective view describing the step of forming second grooves included in the method for fabricating the semiconductor device according to the second embodiment.

Then the blade 60 is used for cutting a groove 43 in a direction (Y direction) perpendicular to the groove 42 in the resin 11 between adjacent solid imaging devices 2 (see FIG. 23).

The depth of the groove 43 is the same as that of the groove 42 previously cut and is, for example, about 300 μm.

Figure 24:
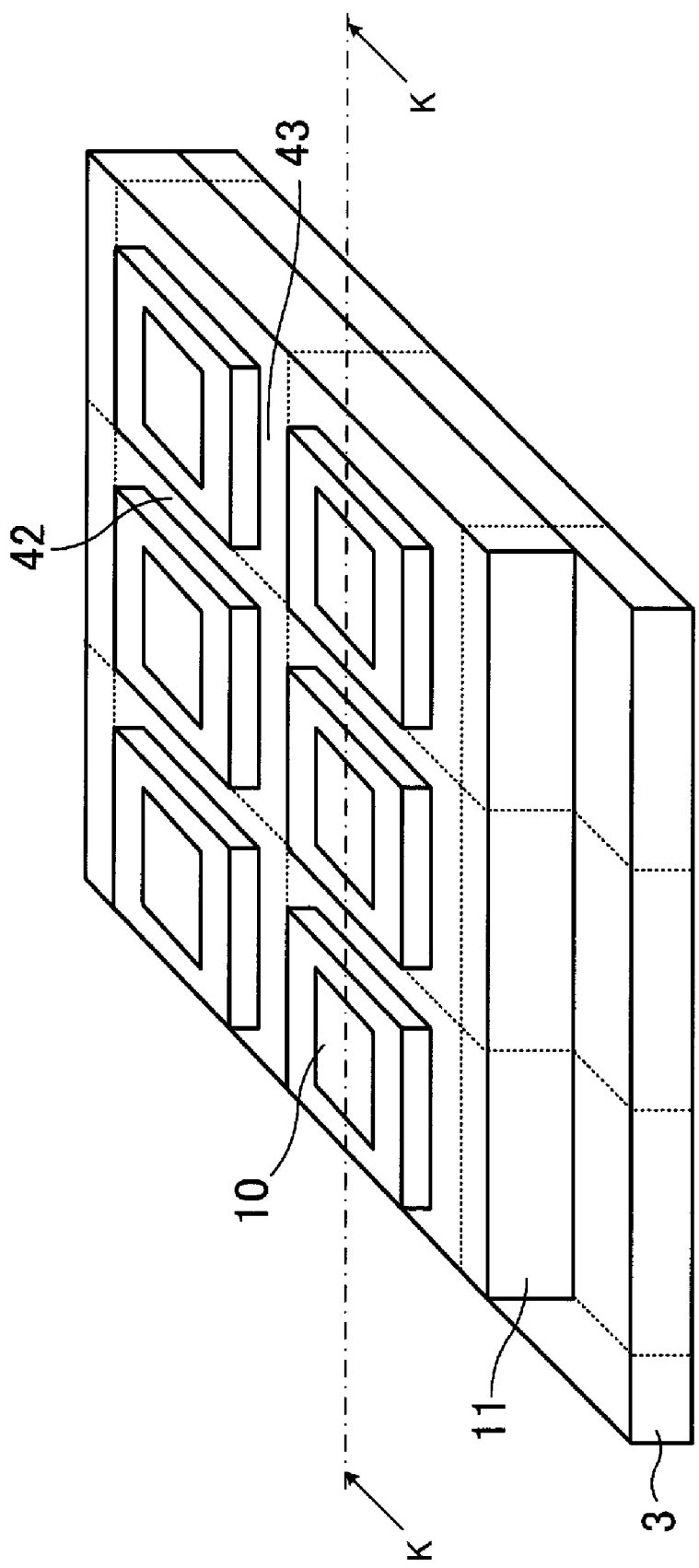
FIG. 24 is a fragmentary perspective view describing the step of separating semiconductor devices included in the method for fabricating the semiconductor device according to the second embodiment.
Figure 25:
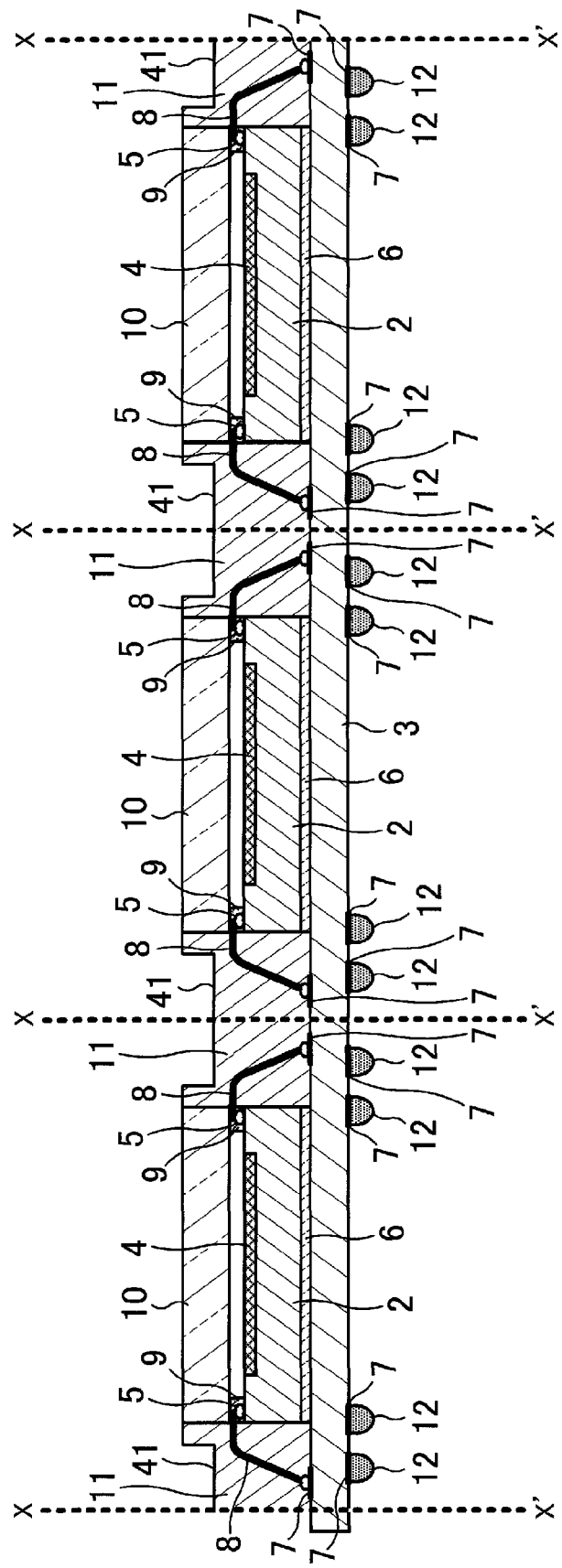
FIG. 25 is a schematic sectional view taken along lines K-K of FIG. 24.

As illustrated in FIGS. 24 and 25, then dicing is performed at the center of the grooves 42 and 43 (indicated by dotted lines X-X' of FIG. 25) to make division. As a result, individual semiconductor devices 40 in the surface of the sealing resin 11 of each step portions 41 are formed are obtained. FIG. 25 is a sectional view taken along lines K-K of FIG. 24.

The relationship between the step portion 41 of the semiconductor device 40 and the shape of a gold wire will now be described with reference to FIGS. 26A and 26B.

With the semiconductor device 1a illustrated in FIG. 2A or 3A, the gold wires 8a are connected to the electrode pads (not illustrated) of the solid imaging device 2a and the adhesives 9a are located inside the portions where the gold wires 8a and the electrode pads of the solid imaging device 2a are connected. In this case, usually the gold wires 8a are connected by first bonding, so a loop formed by each gold wire 8a is of certain height in the sealing resin 11a.

Figure 26A:
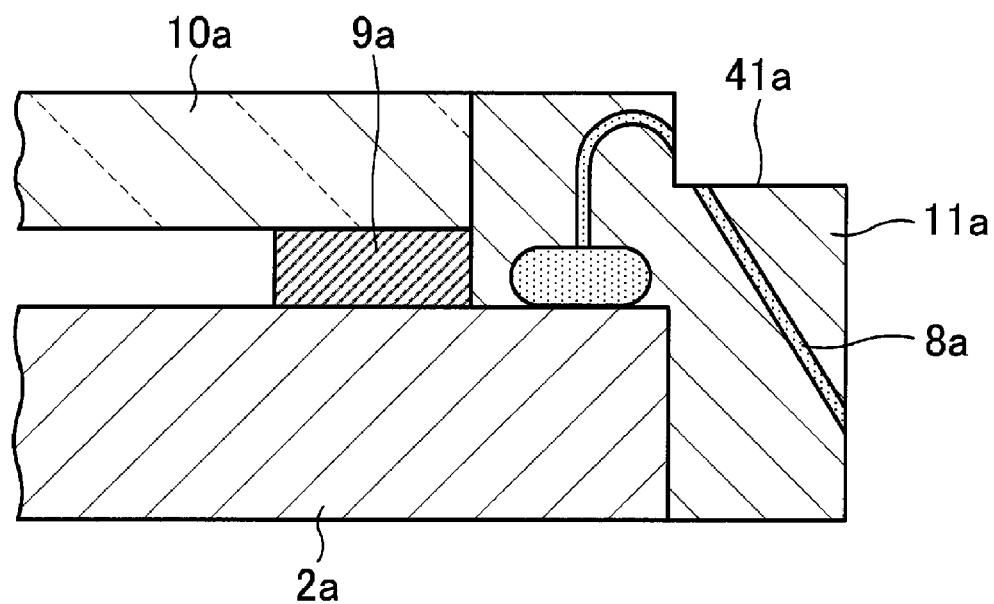
FIGS. 26A and 26B are views for describing difference in level, FIG. 26A being a schematic sectional view describing the semiconductor device in which an adhesive is formed inside portions where gold wires are connected and in which a step portion is formed, FIG. 26B being a schematic sectional view describing the semiconductor device in which an adhesive is formed over portions where gold bumps and gold wires are connected and in which a step portion is formed.
Figure 26B:
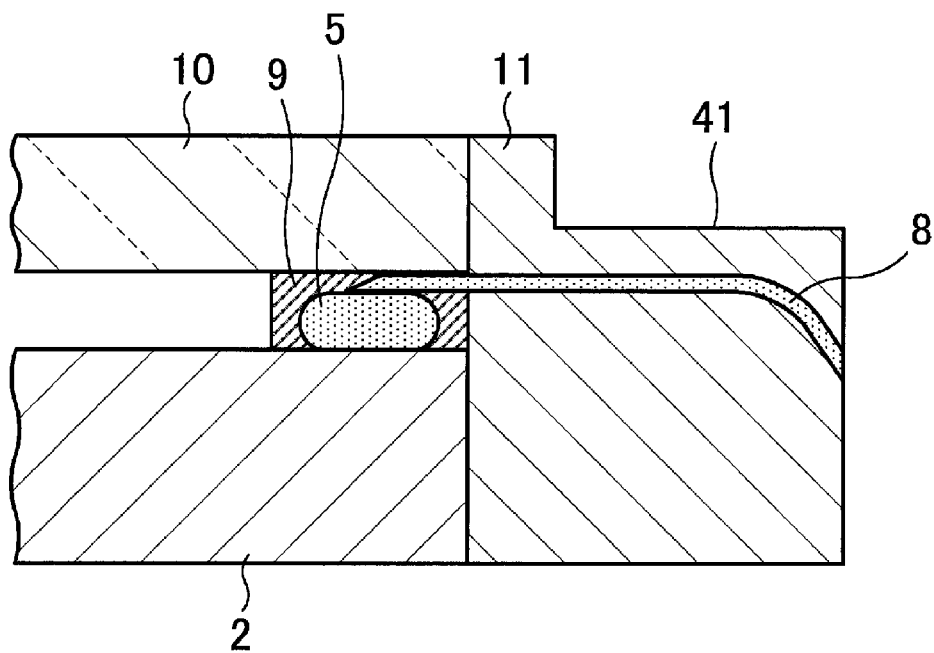

If an attempt is made to use the blade 60 for forming a step portion 41a in the sealing resin 11a in which the gold wire 8a having the above shape is located, the gold wire 8a is cut, as illustrated in FIG. 26A, depending on the depth of the step portion 41a or the height of a loop formed by the gold wire 8a.

With the semiconductor device 40 according to the second embodiment, on the other hand, an end portion of a gold wire 8 is connected to a gold bump 5 and a portion where the end portion of the gold wire 8 and the gold bump 5 are connected is coated with an adhesive 9. Therefore, as illustrated in FIG. 26B, the gold wire 8 can be formed so that it will extend in a direction approximately parallel to the circuit board 3 near the gold bump 5. This is the same with the above semiconductor device 1 according to the first embodiment. That is to say, the height of a loop formed by the gold wire 8 can be controlled.

Accordingly, even if the step portion 41 is formed in the sealing resin 11, the gold wire 8 is not cut.

In addition, the holder 20 can be located and fixed by the use of the step portion 41 without positional deviation.

Third Embodiment

Figure 27:
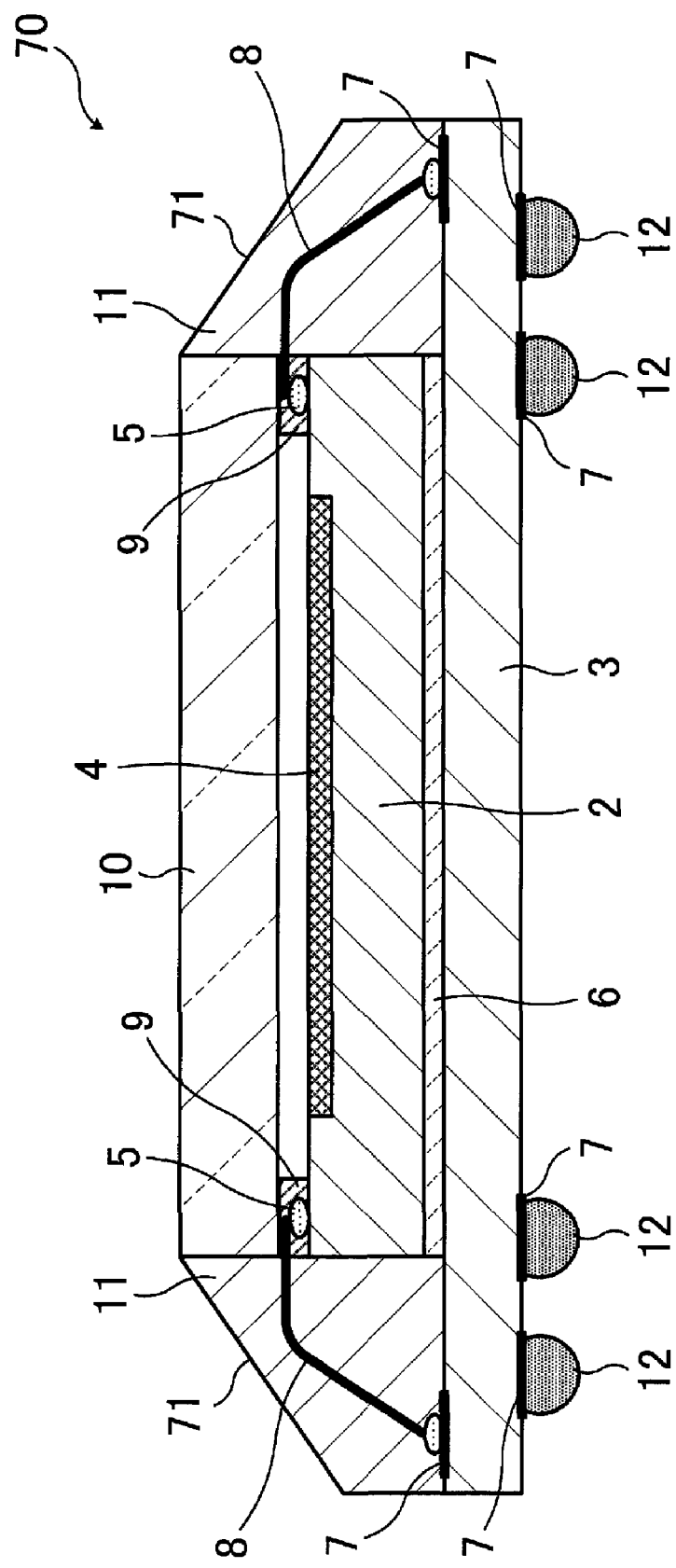
FIG. 27 is a schematic sectional view of a semiconductor device according to a third embodiment.

A third embodiment will now be described by using FIG. 27.

The same components that are included in the semiconductor device according to the first embodiment will be marked with the same symbols and detailed descriptions of them will be omitted.

With a semiconductor device 70 according to a third embodiment, inclined portions 71 which incline from a glass plate 10 toward the sides of the semiconductor device 70 are formed in the surface of resin 11 which seals areas where gold wires 8 and the like are located.

The inclined portions 71 of the semiconductor device 70 can be formed by cutting a groove in the sealing resin 11 between adjacent solid imaging devices 2 before dicing by the use of a blade. This is the same with the above semiconductor device 40 according to the second embodiment.

That is to say, a blade having the shape of the letter "V" having a predetermined angle is used for cutting a groove a cross section of which has the shape of the letter "V" in the sealing resin 11 between adjacent solid imaging devices 2. When dicing is performed, a thin blade is used and is applied to the bottom of the groove.

By doing so, the inclined portion 71 the surface of which inclines is formed in a seal portion of each semiconductor device 70.

The inclined portions 71 of the semiconductor device 70 formed in this way are used when a holder which holds a lens is mounted.

Figure 28:
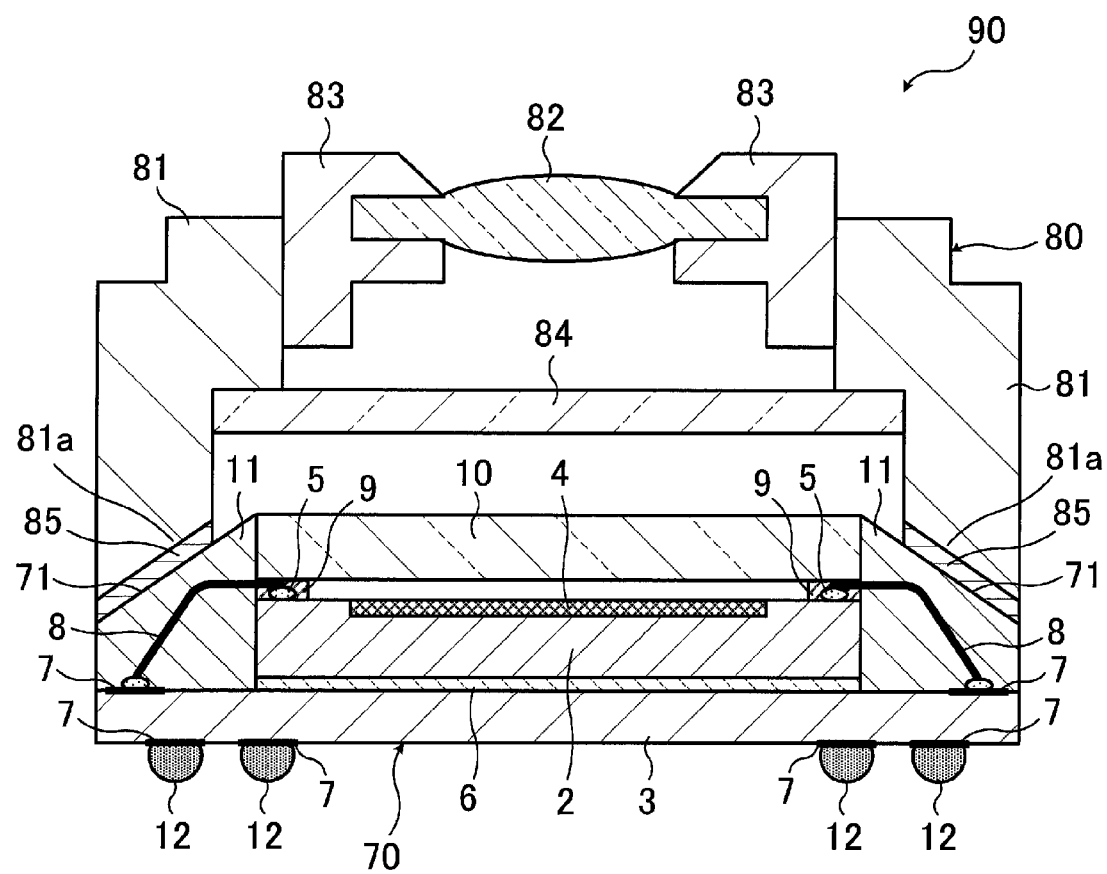
FIG. 28 is a schematic sectional view of an optical module using the semiconductor device according to the third embodiment.

The structure of an optical module using the semiconductor device 70 according to the third embodiment is illustrated in FIG. 28.

With such an optical module a holder 80 is mounted over the semiconductor device 70 with lower end portions 81a of an enclosure 81 bonded to the semiconductor device 70. The lower end portion 81a of the enclosure 81 has a slope corresponding to the shape and tilt angle of the inclined portion 71 of the semiconductor device 70.

A barrel 83 which holds a lens 82 and an infrared ray (IR) filter 84 are fixed in the enclosure 81.

An adhesive 85 is applied to the inclined lower end portions 81a of the enclosure 81 and the lower end portions 81a are bonded to the inclined portions 71 formed in the seal portions of the semiconductor device 70. By doing so, an optical module 90 illustrated in FIG. 28 is formed.

As has been described, the inclined portions 71 which incline are formed in the semiconductor device 70 and the lower end portions 81a of the holder 80 take an inclined shape corresponding to the inclined portions 71. By doing so, the holder 80 can be mounted over the semiconductor device 70 without positional deviation. As a result, the optical axis of the semiconductor device 70 can easily be aligned with the optical axis of the holder 80.

Therefore, by forming the inclined portions 71 and the enclosure 81 with the optical axes of a light receiving region 4 of the solid imaging device 2 and the lens 82 of the holder 80 and the distance between the light receiving region 4 of the solid imaging device 2 and the lens 82 of the holder 80 taken into consideration, the optical module 90 can be formed without deviation between the optical axes of the light receiving region 4 of the solid imaging device 2 and the lens 82 of the holder 80.

In addition, by forming the inclined portions 71 of the semiconductor device 70 and the corresponding lower end portions 81a of the enclosure 81 of the holder 80, the area of contact of the semiconductor device 70 with the holder 80 increases. This effectively prevents moisture or the like from entering between the semiconductor device 70 and the holder 80.

Fourth Embodiment

A fourth embodiment will now be described by using FIGS. 29A and 29B.

The same components that are described in the first embodiment will be marked with the same symbols and detailed descriptions of them will be omitted.

Figure 29A:
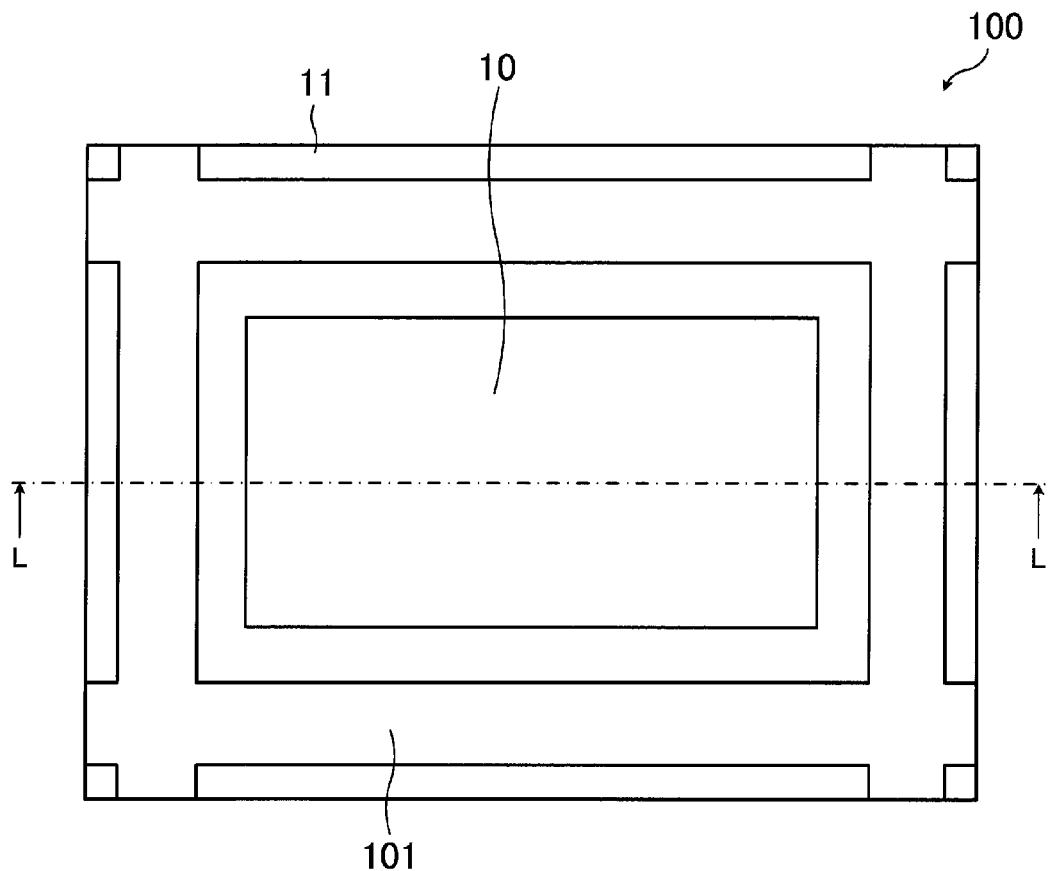
FIGS. 29A and 29B are schematic views of a semiconductor device according to a fourth embodiment, FIG. 29A being a schematic plan view of the semiconductor device according to the fourth embodiment, FIG. 29B being a schematic sectional view taken along lines L-L of FIG. 29A.
Figure 29B:
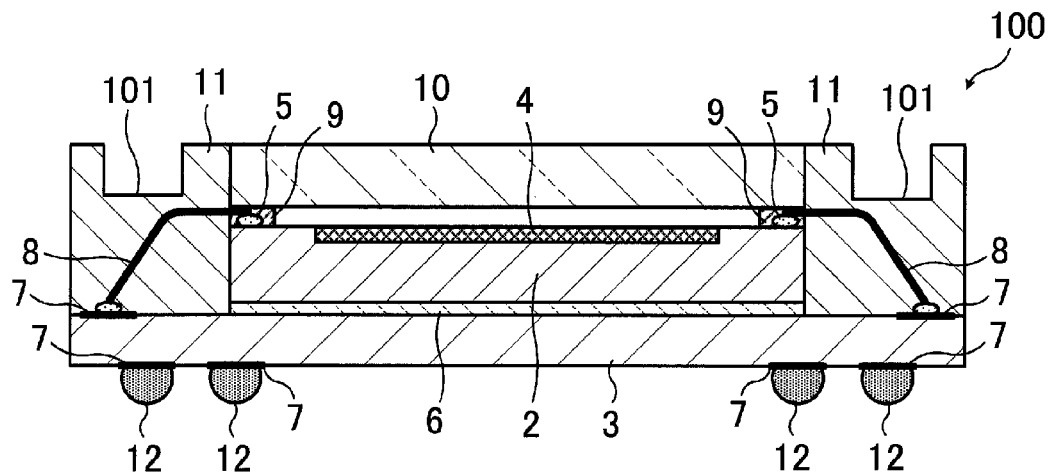

FIG. 29B is a sectional view taken along lines L-L of FIG. 29A.

With a semiconductor device 100 according to a fourth embodiment, step portions 101 cross sections of which have a concave shape are formed in resin 11 which seals areas where gold wires 8 and the like are formed.

The concave step portions 101 are formed by cutting grooves in the sealing resin 11 between adjacent solid imaging devices 2 before dicing by the use of a blade 60. This is the same with the above semiconductor device 40 according to the second embodiment. That is to say, two parallel grooves are cut in the X and Y directions in the sealing resin 11 between adjacent solid imaging devices 2. When dicing is performed, the blade 60 is applied between the two parallel grooves.

By doing so, each semiconductor device 100 obtained has concave step portions 101.

The concave step portions 101 formed in this way are used when a holder which holds a lens is mounted.

Figure 30:
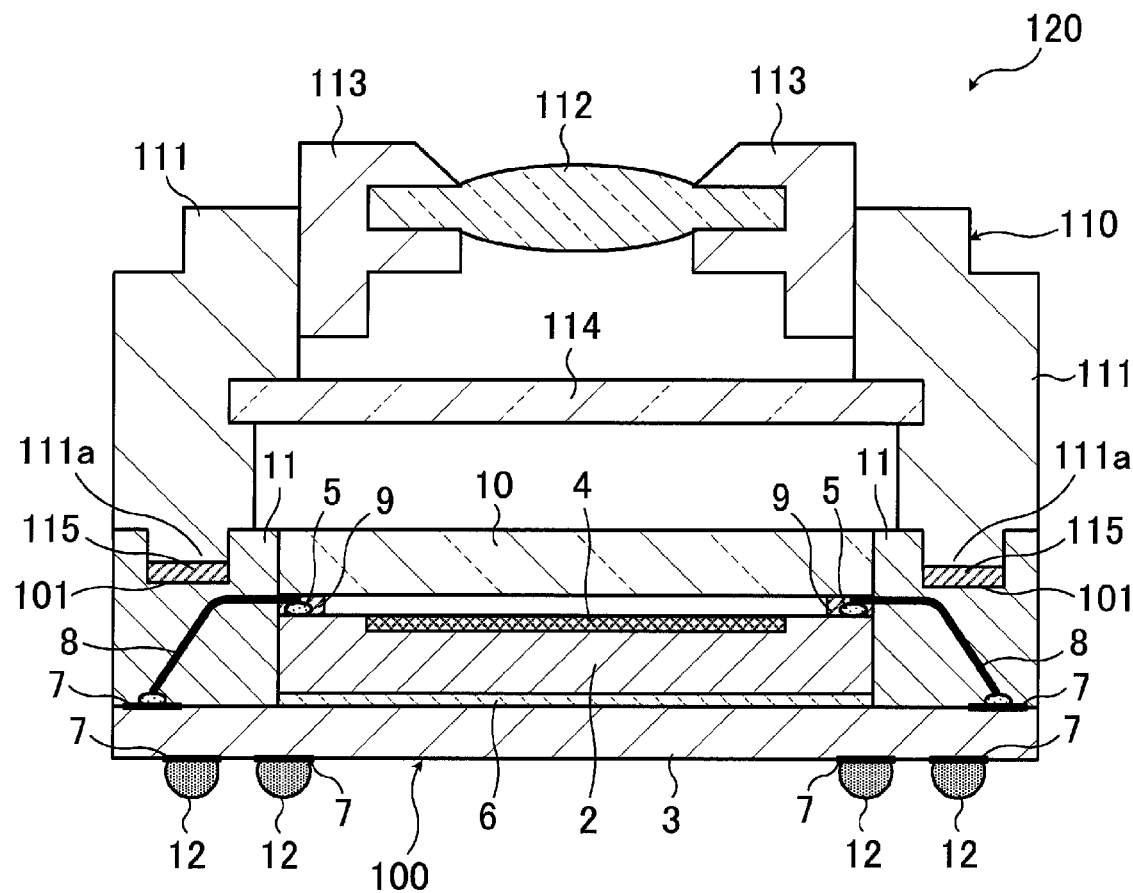
FIG. 30 is a schematic sectional view of an optical module using the semiconductor device according to the fourth embodiment.

An optical module using the semiconductor device 100 according to the fourth embodiment is illustrated in FIG. 30.

A holder 110 is mounted over the semiconductor device 100 having the step portions 101 cross sections of which have a concave shape with lower end portions 111a of an enclosure 111 bonded to the semiconductor device 100. The shape of the lower end portions 111a of the enclosure 111 corresponds to the concave step portion 101 of the semiconductor device 100. That is to say, cross sections of the lower end portions 111a of the enclosure 111 have a convex shape.

A barrel 113 which holds a lens 112 and an infrared ray (IR) filter 114 are fixed in the enclosure 111.

An adhesive 115 is applied to the convex lower end portions 111a of the enclosure 111. Then the lower end portions 111a are fitted into the concave step portions 101 of the semiconductor device 100 and are bonded thereto. By doing so, an optical module 120 illustrated in FIG. 30 is formed.

As a result, the holder 110 which holds the lens 112 can be mounted over the semiconductor device 100 without positional deviation.

By forming the step portions 101 and the enclosure 111 in this way with the optical axes of a light receiving region 4 of the solid imaging device 2 and the lens 112 of the holder 110 and the distance between the light receiving region 4 of the solid imaging device 2 and the lens 112 of the holder 110 taken into consideration, the optical module 120 can be formed without deviation between the optical axes of the light receiving region 4 of the solid imaging device 2 and the lens 112 of the holder 110.

In addition, by forming the concave step portions 101 of the semiconductor device 100 and the corresponding convex lower end portions 111a of the enclosure 111 of the holder 110, the area of contact of the semiconductor device 100 with the holder 110 increases. This effectively prevents moisture or the like from entering between the semiconductor device 100 and the holder 110.

Fifth Embodiment

A fifth embodiment will now be described by using FIGS. 31 and 32.

Figure 31:
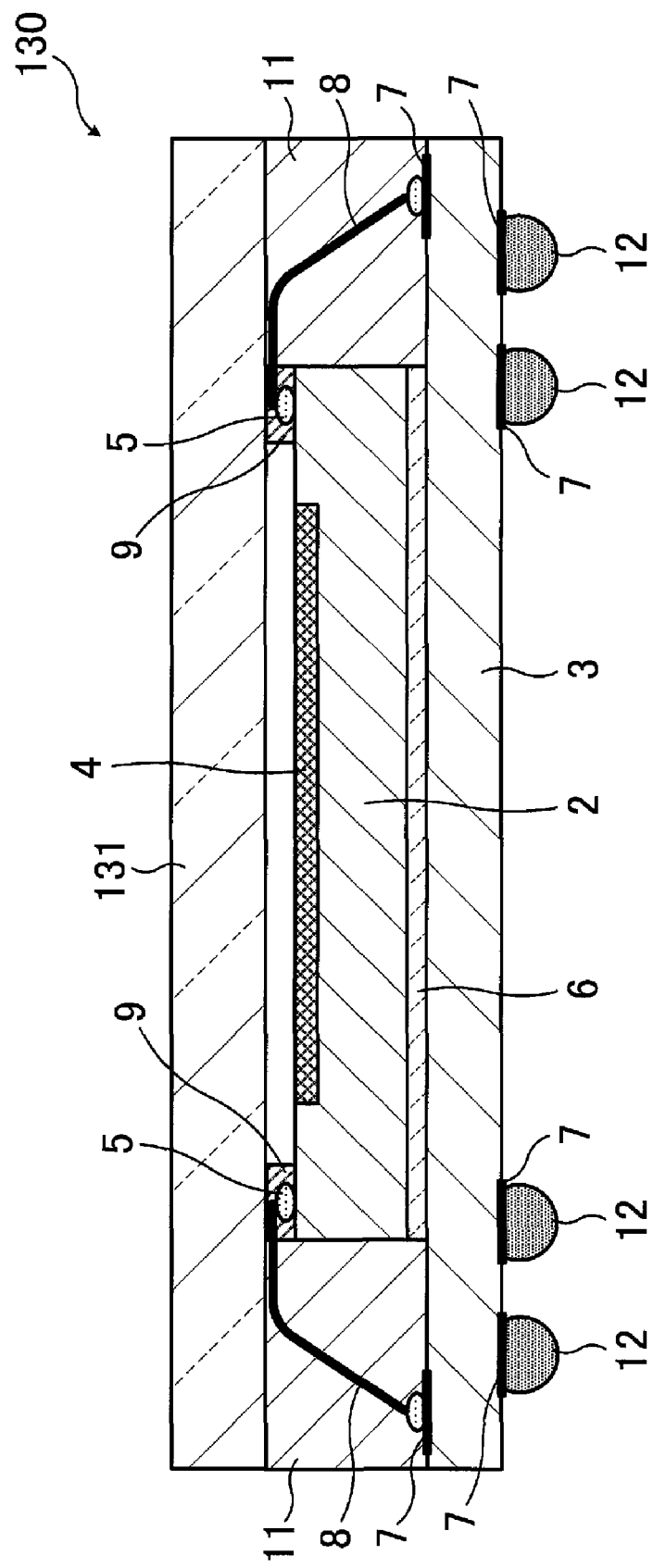
FIG. 31 is a schematic sectional view of a semiconductor device according to a fifth embodiment.
Figure 32:
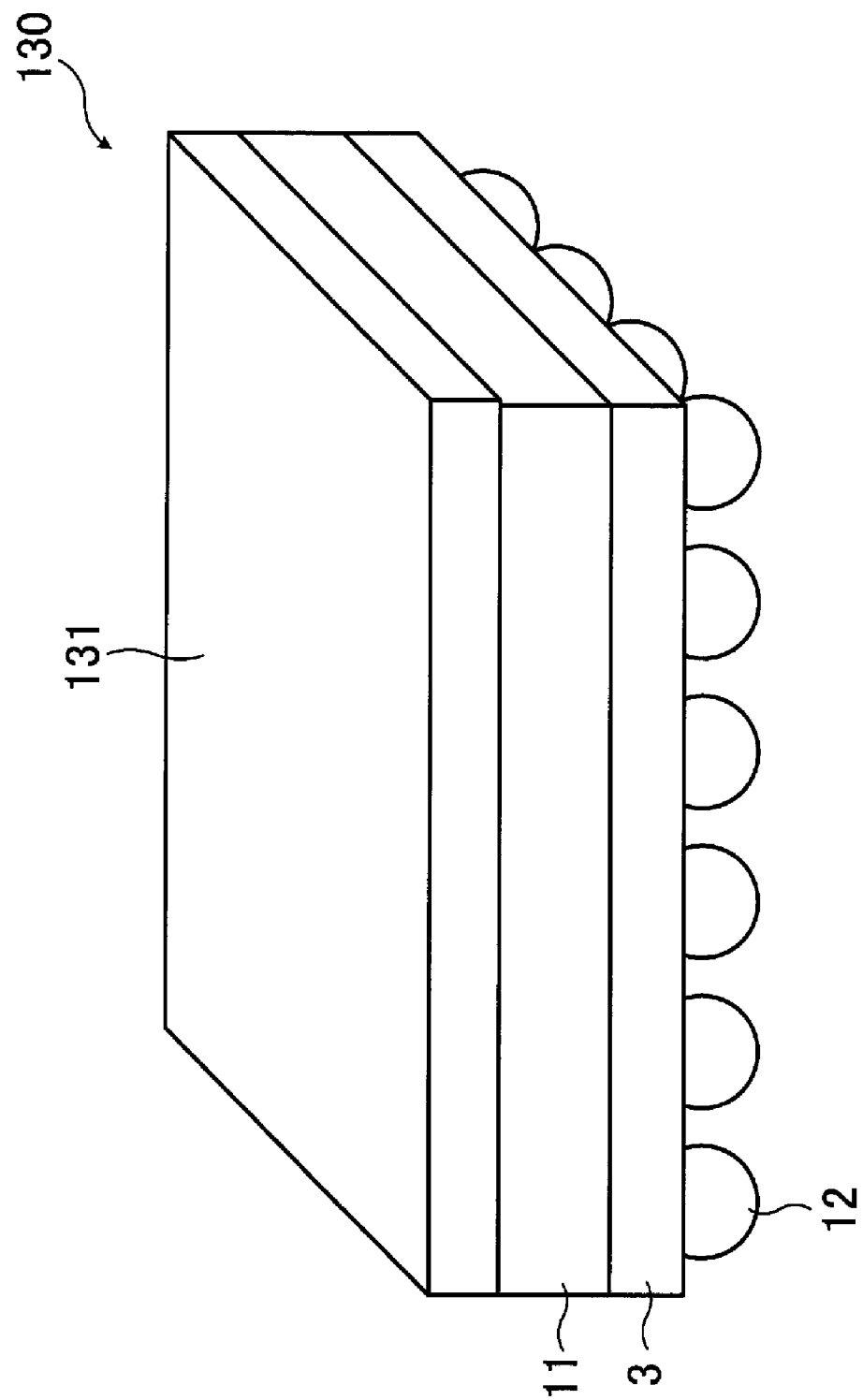
FIG. 32 is a perspective view of the semiconductor device according to the fifth embodiment.

A cross section of a semiconductor device according to a fifth embodiment is illustrated in FIG. 31. Its appearance is illustrated in FIG. 32.

The same components that are described in the first embodiment will be marked with the same symbols.

With a semiconductor device 130 according to a fifth embodiment, a glass plate 131 is located over the whole upper surface (which is opposite to a surface under which external connection terminals 12 are located).

That is to say, with the semiconductor device 130, the glass plate 131 the size of which is the same as that of a circuit board 3 is located over light receiving regions 4 of solid imaging devices 2 and a seal portion is formed outside the solid imaging devices 2 between the glass plate 131 and the circuit board 3 by the use of sealing resin 11.

The same effect that is obtained by the above semiconductor device 1 according to the first embodiment can be achieved even by the semiconductor device 130 having the above structure, and a small light optical module using the semiconductor device 130 can be formed.

A method for fabricating the semiconductor device 130 having the above structure will now be described.

The solid imaging devices 2 are mounted over the circuit board 3 and are made to adhere thereto. Electrode terminals of the solid imaging devices 2 and wiring and electrode patterns formed over the circuit board 3 are connected by gold wires.

These steps are the same as those included in the method for fabricating the above semiconductor device 1 according to the first embodiment and illustrated in FIGS. 6 through 8. Accordingly, detailed descriptions of them will be omitted.

Figure 33:
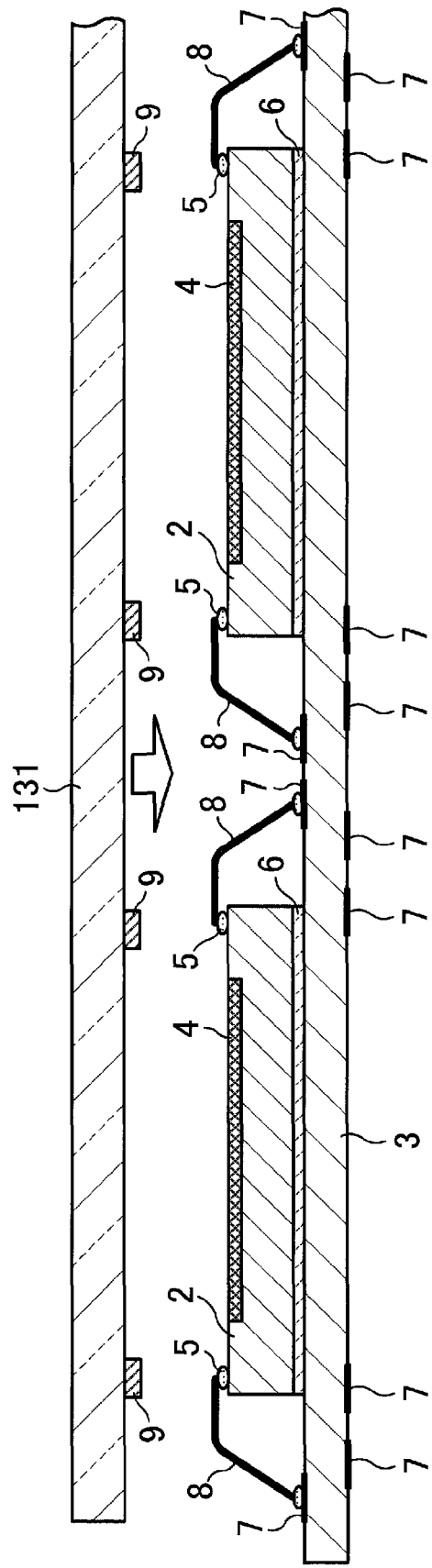
FIG. 33 is a fragmentary schematic sectional view describing the step of mounting glass plates included in a method for fabricating the semiconductor device according to the fifth embodiment.

With the semiconductor device 130 according to the fifth embodiment, the glass plate 131 prepared is large enough to cover all of the solid imaging devices 2 mounted over the circuit board 3. That is to say, the glass plate 131 prepared is at least equal in size to the circuit board 3 (see FIG. 33).

An adhesive 9 is applied in advance to regions of the glass plate 131 which touch portions over each solid imaging device 2 where gold bumps 5 and gold wires 8 are connected at the time of the glass plate 131 being put on each solid imaging device 2. The surface of the glass plate 131 to which the adhesive 9 is applied is bonded to each solid imaging device 2 mounted over the circuit board 3.

The following way may be used. The adhesive 9 is applied in advance to the portions over each solid imaging device 2 where gold bumps 5 and gold wires 8 are connected, and the glass plate 131 is bonded to these portions.

Figure 34:
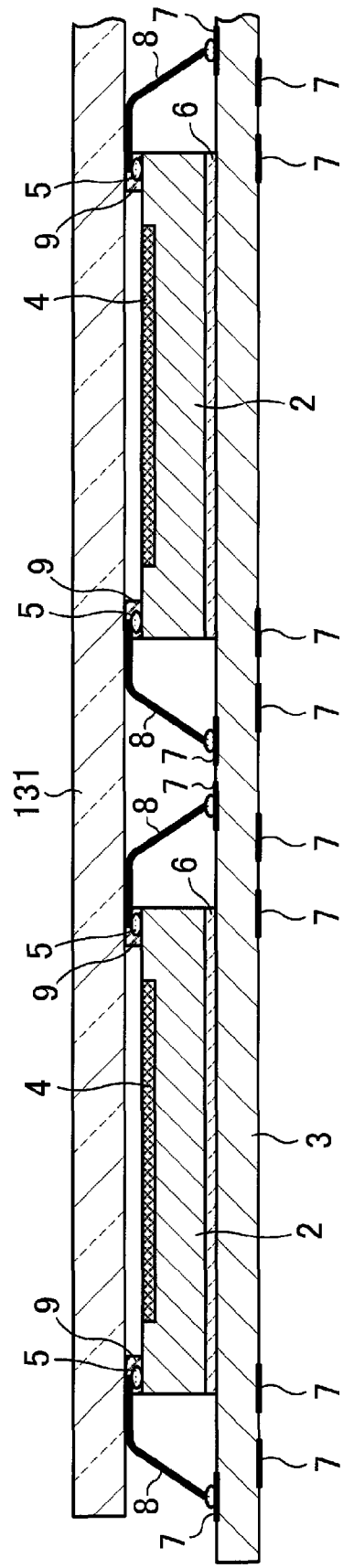
FIG. 34 is a fragmentary schematic sectional view describing the step of hardening an adhesive included in the method for fabricating the semiconductor device according to the fifth embodiment.

Then the adhesive 9 is hardened by a predetermined method according to a material for the adhesive 9. By doing so, the portions where gold bumps 5 and gold wires 8 are connected are coated with the adhesive 9 and the glass plate 131 is supported by the portions where gold bumps 5 and gold wires 8 are connected. In this state, the glass plate 131 is made to adhere over the solid imaging devices 2 (see FIG. 34).

Figure 35:
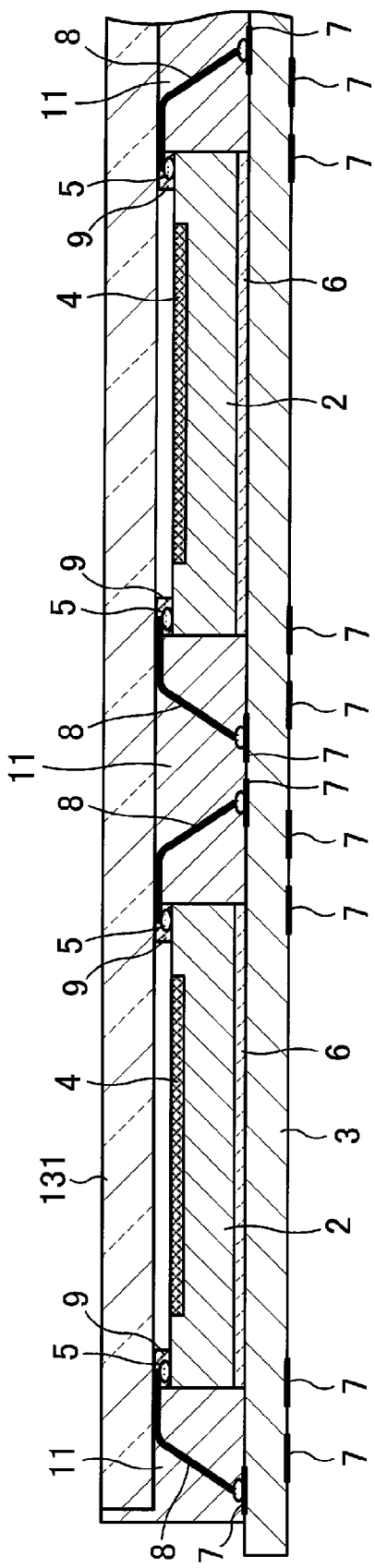
FIG. 35 is a fragmentary schematic sectional view describing the step of sealing by the use of resin included in the method for fabricating the semiconductor device according to the fifth embodiment.

Then the sealing resin 11 is injected between the solid imaging devices 2 which are between the glass plate 131 and the circuit board 3, and is hardened (see FIG. 35).

In order to inject the sealing resin 11, a resin molding method is applied by the use of a predetermined metal mold.

Figure 36:
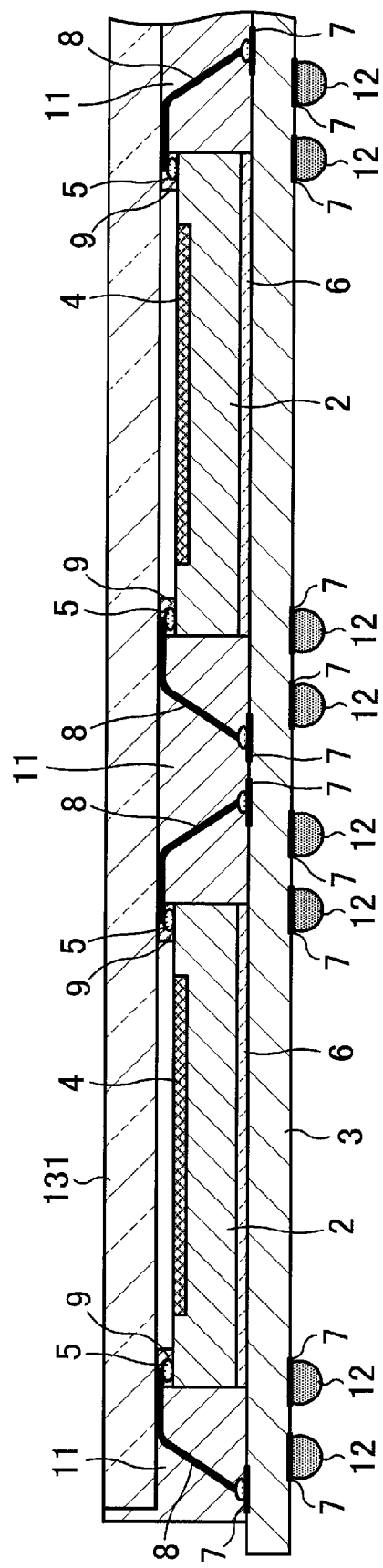
FIG. 36 is a fragmentary schematic sectional view describing the step of forming solder balls included in the method for fabricating the semiconductor device according to the fifth embodiment.

Then solder balls are located as external connection terminals 12 under a wiring pattern 7 formed under a principal plane of the circuit board 3 opposite to a principal plane over which the solid imaging devices 2 are mounted (see FIG. 36).

Figure 37:
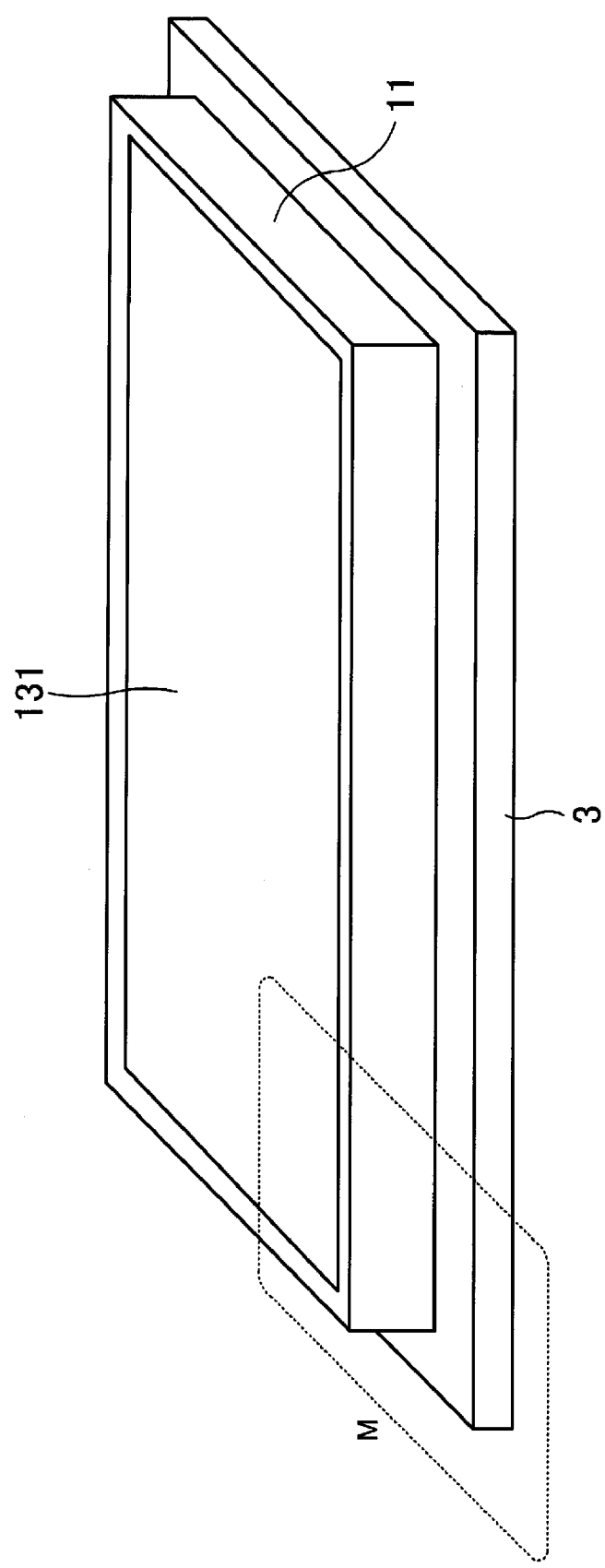
FIG. 37 is a perspective view describing a group of the semiconductor devices according to the fifth embodiment after the formation of solder balls.

By following the above fabrication procedure, an aggregate of semiconductor devices 130 before dicing in which a plurality of solid imaging devices 2 are located over the circuit board 3 and in which the glass plate 131 is located over the plurality of solid imaging devices 2 is obtained (see FIG. 37).

Figure 38:
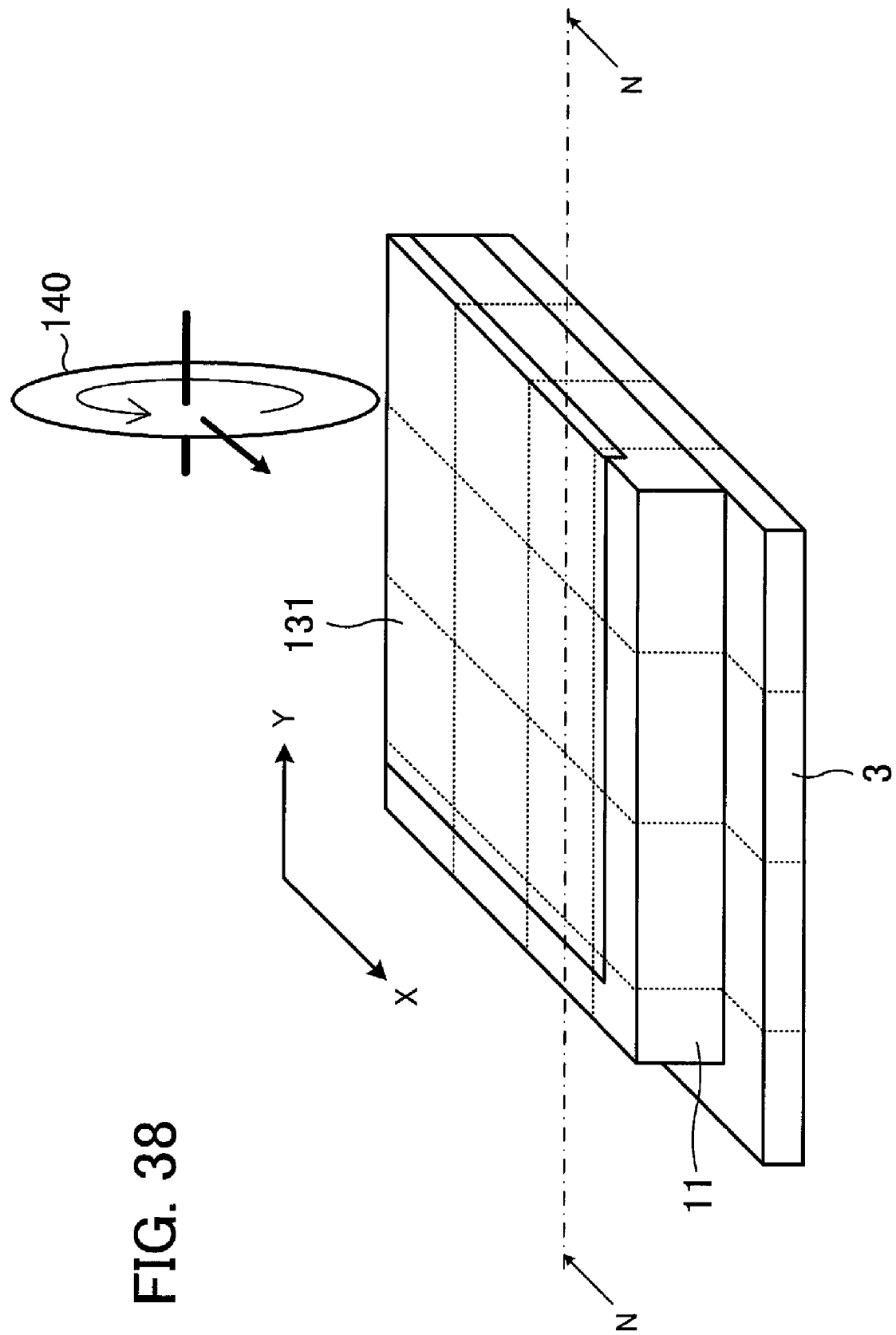
FIG. 38 is a fragmentary perspective view describing the step of separating semiconductor devices included in the method for fabricating the semiconductor device according to the fifth embodiment.
Figure 39:
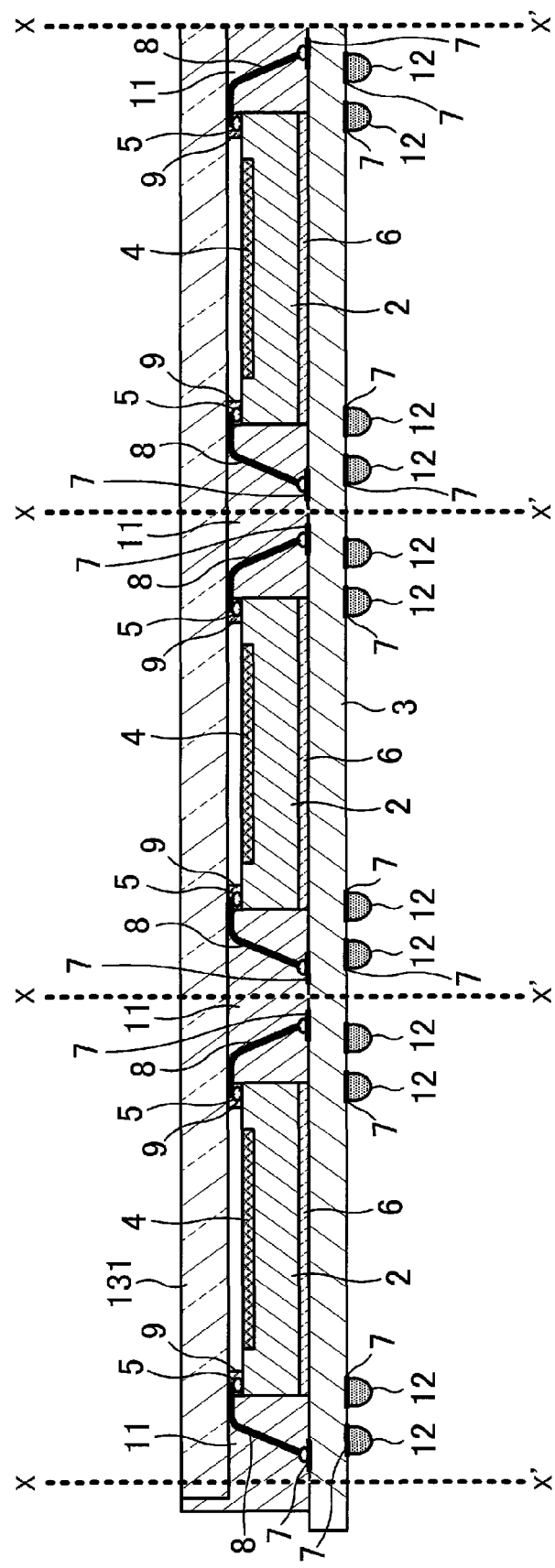
FIG. 39 is a schematic sectional view taken along lines N-N of FIG. 38.
Figure 40:
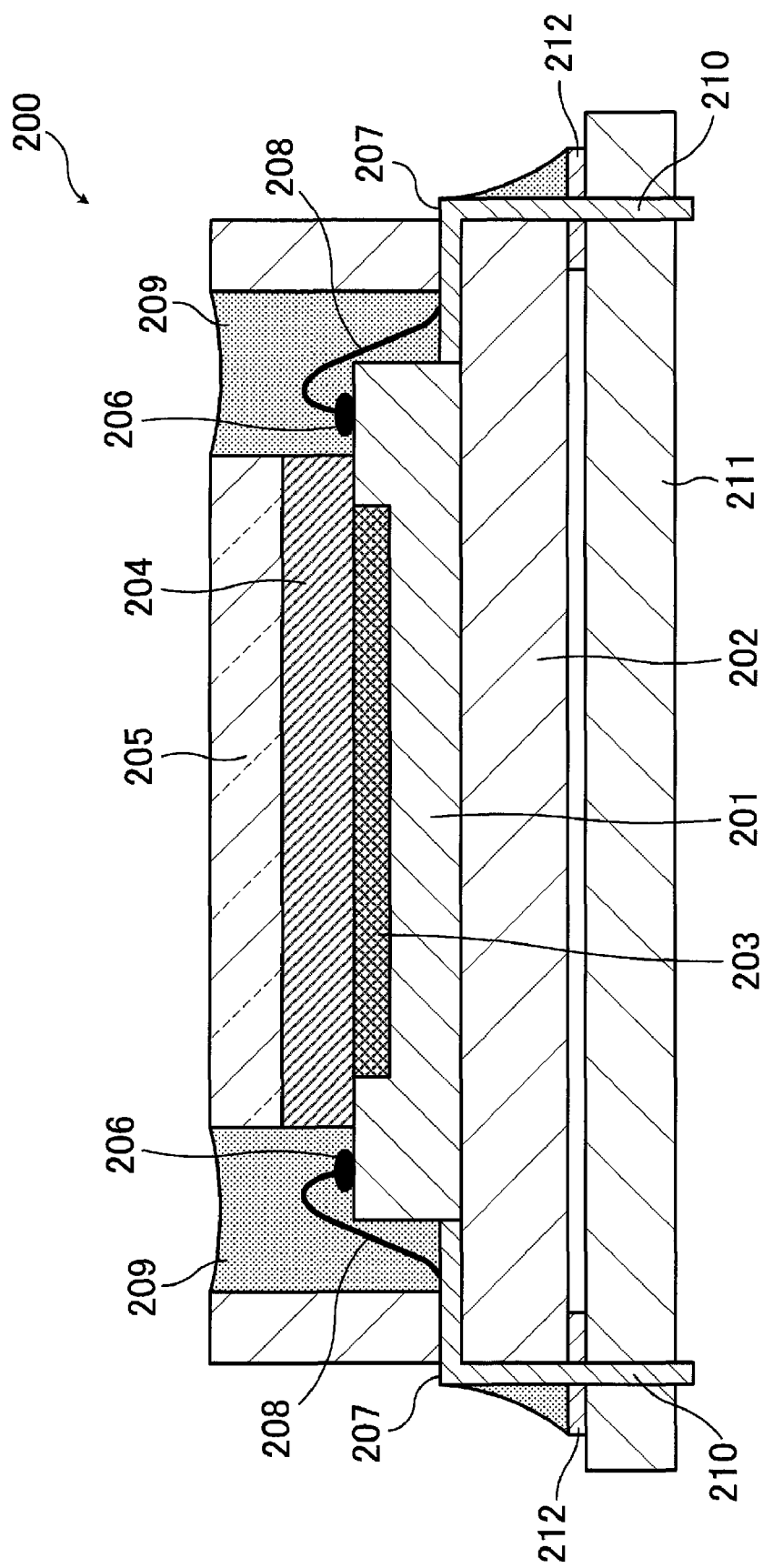
FIG. 40 is a view describing an example of a conventional semiconductor device including a solid imaging device.

As illustrated in FIGS. 38 and 39, a blade 140 is used for cutting (dicing) the glass plate 131, the sealing resin 11, and the circuit board 3 between adjacent solid imaging devices 2 in the X and Y directions along dotted lines X-X' of FIG. 39. By doing so, the aggregate of semiconductor devices 130 is separated into individual semiconductor devices 130.

In the above embodiments gold bumps 5 are illustrated as bumps formed over the electrode pads of the solid imaging device 2. However, bumps other than such ball bumps may be formed.

For example, a mask is formed over the solid imaging devices 2 except pads by the use of proper photoresist or the like, a metallic deposit is formed over the exposed pads, and the mask is removed. By doing so, what is called plated bumps can be formed over the pads. In this case, the size (area and thickness) of each bump can be selected by controlling the thickness of the mask or conditions under which plating treatment is performed.

The structure of the semiconductor devices described above can be applied not only to the above solid imaging device but also to a fingerprint sensor element and the like.

According to the embodiments, gold bumps are located at electrode terminal portions of a semiconductor element such as a solid imaging device, the gold bumps and a wiring pattern formed over a board over which the semiconductor element is mounted are connected by gold wires, an adhesive is located over the gold bumps, and a transparent plate such as a glass plate is made to adhere over the semiconductor element.

By doing so, the semiconductor element can be made small and light. As a result, a semiconductor device including the semiconductor element and the transparent plate located over the semiconductor element can be made small and light and production costs can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that various changes, substitutions and alterations could be made hereto without departing from the spirit and scope of the invention.

What is claimed is:

1. A semiconductor device comprising:
    a solid imaging device having a light receiving region;
    a board over which the solid imaging device is mounted;
    gold bumps located around the light receiving region of the solid imaging device;
    wire wirings which connect electrodes formed over the board and the gold bumps;
    a transparent plate which covers the light receiving region and which is supported by the gold bumps; and
    a seal member which seals sides of the solid imaging device, sides of the transparent plate, and the wire wirings.

2. The semiconductor device according to claim 1, wherein a holder which holds a lens is fixed over the seal member.

3. The semiconductor device according to claim 1, wherein the seal member has a step portion.

4. The semiconductor device according to claim 3, wherein the step portion forms a shape so that a surface of the seal member inclines toward an outside.

5. The semiconductor device according to claim 3, wherein a cross section of the step portion of the seal member is concave.

6. The semiconductor device according to claim 3, wherein a holder which holds a lens is fixed over the step portion.

7. A method for fabricating a semiconductor device, the method comprising:
    locating a solid imaging device having bumps around an imaging region over a board over which a wiring pattern is formed;
    connecting the wiring pattern and the bumps by wire wirings;
    forming an adhesive over portions where the bumps and the wire wirings are connected, and bonding a transparent plate opposite the solid imaging device by the adhesive; and
    forming a seal member which seals sides of the solid imaging device, sides of the transparent plate, and the wire wirings by resin.

8. The method according to claim 7, further comprising fixing a holder which holds a lens over the seal member after the forming of the seal member.

9. The method according to claim 7, further comprising forming a step portion in the seal member after the forming of the seal member.

10. The method according to claim 9, wherein in the forming of the step portion, the step portion forms a shape so that a surface of the seal member inclines toward an outside.

11. The method according to claim 9, wherein in the forming of the step portion, the step portion is formed so that a cross section of the seal member is concave.

12. The method according to claim 9, further comprising fixing a holder which holds a lens over the step portion after the forming of the step portion.

13. A method for fabricating a semiconductor device, the method comprising:
    mounting a plurality of semiconductor elements over a wiring board;
    making a transparent plate adhere over gold bumps located over the plurality of semiconductor elements;
    forming a seal member by sealing adjacent semiconductor elements by resin: and
    cutting and separating the wiring board and the transparent plate en bloc into individual semiconductor devices each including a semiconductor element.

14. The method according to claim 13, wherein in the making the transparent plate adhere over the gold bumps located over the plurality of semiconductor elements, the transparent plate which covers all of the plurality of semiconductor elements is bonded opposite all of the plurality of semiconductor elements.

* * * * *